United States Patent [19]
Tohmori et al.

[11] Patent Number: 5,325,392
[45] Date of Patent: Jun. 28, 1994

[54] DISTRIBUTED REFLECTOR AND WAVELENGTH-TUNABLE SEMICONDUCTOR LASER

[75] Inventors: Yuichi Tohmori, Isehara; Yoshikuni, Tokyo; Hiroyuki Ishii; Fumiyoshi Kano, both of Zama; Toshiaki Tamamura, Atsugi, all of Japan

[73] Assignee: Nippon Telegraph and Telephone Corporation, Chiyoda, Japan

[21] Appl. No.: 26,451

[22] Filed: Mar. 3, 1993

[30] Foreign Application Priority Data

| Mar. 6, 1992 | [JP] | Japan | 4-049425 |
| Jun. 4, 1992 | [JP] | Japan | 4-144117 |
| Aug. 5, 1992 | [JP] | Japan | 4-208986 |
| Aug. 10, 1992 | [JP] | Japan | 4-213084 |
| Aug. 17, 1992 | [JP] | Japan | 4-217693 |
| Aug. 21, 1992 | [JP] | Japan | 4-222718 |

[51] Int. Cl.$^5$ .............................................. H01S 3/10
[52] U.S. Cl. .................................... 372/96; 372/20; 372/46; 372/50; 385/14
[58] Field of Search ............. 372/20, 96, 46, 50; 385/14

[56] References Cited

U.S. PATENT DOCUMENTS

| 4,856,005 | 8/1989  | Oe et al.     | 372/20 |
| 4,885,753 | 12/1989 | Okai et al.   | 372/45 |
| 4,896,325 | 1/1990  | Coldern       | 372/20 |
| 5,155,737 | 10/1992 | Ikeda et al.  | 372/43 |
| 5,187,717 | 2/1993  | Horita et al. | 372/96 |

FOREIGN PATENT DOCUMENTS

| 0267667 | 5/1988 | European Pat. Off. . |
| 0397045 | 11/1990 | European Pat. Off. . |
| 3706866 | 9/1988 | Fed. Rep. of Germany . |
| 2209408 | 5/1989 | United Kingdom . |

OTHER PUBLICATIONS

Patent Abstracts of Japan, vol. 15, No. 379, Sep. 25, 1991 JP No. 31 50 890, Hitachi, Jun. 27th, 1991.
Patent Abstracts of Japan, vol. 9, No. 318, Dec. 13, 1985 JP No. 60 152 086, Hitachi, Aug. 10th, 1985.
Patent Abstracts of Japan, vol. 13, No. 574, Dec. 19, 1989 JP No. 12 39 892, Fujitsu, Sep. 25th, 1989.
Patent Abstracts of Japan, vol. 8, No. 21, Jan. 28, 1984 JP No. 58 182 890, Nippon Denki, Oct. 25th, 1983.

*Primary Examiner*—James W. Davie
*Attorney, Agent, or Firm*—Spencer, Frank & Schneider

[57] ABSTRACT

The distributed reflector includes a substrate and at least one optical waveguide formed on the substrate and having a refractive index larger than the substrate and at least one optical confinement layer having a refractive index smaller than the optical waveguide layer. A diffractive grating is formed in at least one layer constituting the optical waveguide. The diffractive grating has a structure of which at least one parameter defining optical reflectivity varies depending on its position, and is formed continuously for at least two periods, the period being approximately defined by the length of repeating unit region. The parameter may be pitch, coupling coefficient, bandgap composition, phase shift, etc. The semiconductor laser includes the distributed reflector which may be of a distributed reflector type or distributed feed back type and has distributed reflector regions and a phase adjustment region. Application of current or voltage to the refractive index of the active region or inactive region in which a diffractive grating is present or absent adjusts the refractive index thereof and enables coarse and fine adjustment of lasing wavelength.

23 Claims, 18 Drawing Sheets

DISTRIBUTED REFLECTOR AND WAVELENGTH-TUNABLE SEMICONDUCTOR LASER

BACKGROUND OF THE INVENTION

1. Field of the Invention

The present invention relates to a distributed reflector and a semiconductor laser with such a distributed reflector useful in optical transmission field, and more particularly to a wavelength-tunable semiconductor laser with a distributed reflector which is suitable as a light source for transmission, a tunable light source for synchronous rectification, and a light source for photometry in optical wavelength (frequency) multiplexing communication systems.

2. Description of the Prior Art

As a wavelength-tunable light source, distributed reflector type semiconductor lasers have been studied widely. FIG. 1A is a schematic cross-sectional view showing a basic structure of a first conventional example of a wavelength-tunable distributed reflector type semiconductor laser. (e.g., Y. Tohmori et al., Electronics Letters, Vol. 19, p. 656 (1983)). In FIG. 1A, 2 is an active waveguide layer, 3 an inactive waveguide layer, 20 a diffractive grating, 101 an active region, 102 a front side distributed reflection region, 103 a rear side distributed reflection region, and 104 a phase adjustment region. In such a type of laser, the distributed reflectors on the both front and rear sides have identical peak wavelengths and can lase stably at a low threshold value when their respective reflectivities are high.

However, in the first conventional example, the distributed reflector regions 102 and 103 each may be deemed to have a uniform pitch $\Lambda$, and a uniform equivalent refractive index, $n_{eq}$, as illustrated in FIG. 1B. Hence, Bragg wavelength, $\lambda_B$, at which a high reflectivity is obtained will be observed as a single line as illustrated in FIG. 1C. Tunable range of a lasing wavelength is an amount of variation $\Delta\lambda$ ($=2\Lambda \cdot \Delta n_{eq}$) from the Bragg wavelength, $\lambda_B$, and depends on the amount of variation $\Delta n_{eq}$ of the equivalent refractive index, $n_{eq}$, caused by current injected into the distributed reflector region. Incidentally, a maximum relative equivalent refractive index variation, $\Delta n_{eq}/n_{eq}$, is 1% or less, and various workers on experiments on wavelength tunability with the above-mentioned conventional distributed reflector type semiconductor lasers (cf., e.g., Y. Kotaki, et al., Electronics Letters, Vol. 23, p. 327 (1987)) remained to report wavelength tunable ranges on the order of 10 nm, which is insufficient for providing a light source for optical wavelength multiplexing communication systems.

Recently, a distributed reflector as shown in FIG. 2A has been proposed which enables wavelength tuning within the range on the order of above 10 nm, which is referred to herein as reflector according to a second conventional example. In FIG. 2A, broken line indicates portions whose depiction has been omitted. In this case, the waveguide has a diffractive grating of a pitch of $\Lambda$, formed partially and periodically, thereby giving a plurality of reflection peaks in the vicinity of Bragg wavelength, $\lambda_B$, which depends on the pitch, $\Lambda$, as illustrated in FIG. 2B. In a laser structure, one of the reflection peaks is selected electrically (i.e., rough adjustment of wavelength), and wavelength tuning is performed in the vicinity of the selected reflection peak (i.e., fine adjustment of wavelength) (cf. U.S. Pat. No. 4,896,325 to L. A., Coldren et al.; and V. Jayaraman et al., LEOS, "91, paper SDL15.5, 1991). There is a report on wavelength tuning which says only on an experimental basis, rough adjustment on the order of 50 nm was made (V. Jayaraman et al., IEEE, 13th International Conference on Semiconductor Lasers, Post Deadline Papers PD-11).

In the second conventional reflector, as will be understood from FIG. 2B, reflectivities decrease considerably as the wavelengths depart from Bragg wavelength, $\lambda_B$. There has been no report on continuous operation of a wavelength-tunable semiconductor laser having the above-mentioned reflector according to the second conventional example while only pulse operation was made to confirm its action.

With view to complying to expected rapid and great increase in the amount of communication and information in future, various investigations have been made on optical wavelength (frequency) multiplexing communication systems and there is a keen desire on the development of a light source with a wavelength tunability over a wide range as a light source for transmission, and synchronous rectification. Also, it is desired to realize a wavelength-tunable light source which can cover a wide band useful in the field of photometry.

SUMMARY OF THE INVENTION

Under the circumstances, the present invention has been made, and it is an object of the present invention to provide a distributed reflector which has a plurality of sharp high reflectivity peaks distributed at the same spacing over a wide band.

Another object of the present invention is to provide a wavelength-tunable semiconductor laser which solves the problems of the conventional wavelength-tunable semiconductor lasers and which enables a wide range wavelength tuning over about 100 nm or more which is by one digit larger than has been achieved conventionally in a single mode wavelength tuning, and which causes no increase in threshold value within the tunable wavelength range even when the distributed reflector region has a relative equivalent refractive index variation, $\Delta n_{eq}/n_{eq}$, that is on the same level as the conventional one (about 1%).

As a result of extensive investigation, it has now been found that the above object can be achieved by providing an optical waveguide including a substrate having thereon an optical waveguide layer with an optical refractive index greater than the substrate, an optical confinement layer with an optical refractive index smaller than the optical waveguide layer, and a diffractive grating, in which at least one parameter that determines an optical reflectivity of the diffractive grating varies depending on its position. The present invention has been completed based on this discovery.

Therefore, according to a first aspect of the present invention, there is provided a distributed reflector comprising: a substrate; at least one optical waveguide layer provided on the substrate and having an optical refractive index greater than the substrate; at least one optical confinement layer provided on the substrate and having an optical refractive index smaller than the optical waveguide layer; and a diffractive grating provided in at least one of layers constituting the optical waveguide and having a period, the distributed reflector reflecting light having a wavelength approximately defined by Bragg diffraction conditions, wherein the diffractive grating has a plurality of repeating unit regions each having a constant length, thus forming a modulation period, and at least one parameter the determines an optical reflectivity of the diffractive grating varies depending on its position in each of the repeating unit regions along a direction of optical transmission in the distributed reflector; and wherein the diffractive grating extends by at least two modulation periods.

Here, the parameter may be a length of a single period. The parameter may be a coupling coefficient. Also, the parameter may be a bandgap composition of at least one of the optical waveguide layer in the direction of optical transmission. Further, the parameter may be at least one phase shift in which a length of a single period of the diffractive grating differs.

The substrate may be a semiconductor substrate.

According to a second aspect of the present invention, there is provided a distributed reflector semiconductor laser having an optical waveguide comprising: an active waveguide layer defining an active waveguide region, at least one inactive waveguide layer optically connected to the active waveguide layer, defining an inactive region having a refractive index, a diffractive grating provided in at least a portion of the inactive region; a distributed reflector constituted by the diffractive grating, the active region and the inactive region; the active region having an optical gain to light having a wavelength which the distributed reflector reflects; the active region having an optical amplification action and the distributed reflector having a reflection action, and together causing lasing at at least one of reflection wavelengths in the distributed reflector; the diffractive grating in the at least one distributed reflector having a plurality of repeating unit regions each having a constant length, thus forming a modulation period, and at least one parameter the determines an optical reflectivity of the diffractive grating varying depending on its position in each of the repeating unit regions along a direction of optical transmission in the distributed reflector; the diffractive grating extending by at least two modulation periods; and means for electrically controlling the refractive index of the inactive region.

Here, the parameter may be a length of a single period. The parameter may be a coupling coefficient. Also, the parameter may be a bandgap composition of at least one of the optical waveguide layer in the direction of optical transmission. Further, the parameter may be at least one phase shift in which a length of a single period of the diffractive grating differs.

The means for controlling the refractive index may be one for injecting current in the inactive region in which the diffractive grating is present.

Also, the means for controlling the refractive index may be one for injecting current in the inactive region in which the diffractive grating is absent.

The distributed reflector semiconductor laser may further include two sets of independently arranged comb-shaped electrodes in the inactive region in which the diffractive grating is present.

According to a third aspect of the present invention, there is provided a distributed feed back semiconductor laser having an optical waveguide comprising: an active waveguide layer defining an active region having a refractive index, an inactive waveguide layer optically connected to the active waveguide layer, defining an inactive region, a diffractive grating provided in at least a portion of the active region; a distributed reflector constituted by the diffractive grating, the active region and the inactive region; the active region having an optical gain to light having a wavelength which the distributed reflector reflects; the active region having an optical amplification action and the distributed reflector having a reflection action, and together causing lasing at least one of reflection wavelengths in the distributed reflector; the diffractive grating in the at least one distributed reflector having a plurality of repeating unit regions each having a constant length, thus forming a modulation period, and at least one parameter the determines an optical reflectivity of the diffractive grating varying depending on its position in each of the repeating unit regions along a direction of optical transmission in the distributed reflector; the diffractive grating extending by at least two modulation periods; and means for electrically controlling the refractive index of the inactive region.

Here, the parameter may be a length of a single period. The parameter may be a coupling coefficient. Also, the parameter may be a bandgap composition of at least one of the optical waveguide layer in the direction of optical transmission. Further, the parameter may be at least one phase shift in which a length of a single period of the diffractive grating differs.

The means for controlling the refractive index may be one for injecting current in the active region in which the diffractive grating is present.

Also, the means for controlling the refractive index may be one for injecting current in the active region in which the diffractive grating is absent.

The distributed feed back semiconductor laser may further include two sets of independently arranged comb-shaped electrodes in the active region in which the diffractive grating is present.

Further, the distributed feed back semiconductor laser may further include: a wavelength control layer which is transparent to emitted light and controls the refractive index of the active region by variation in density of a carrier; and means for independently controlling currents injected in the active waveguide layer and the wavelength control layer; whereby enabling tuning a lasing wavelength by the current injected to the wavelength control layer.

As described above, according to the present invention, a semiconductor laser having a wavelength tunability which enables a wide range wavelength tuning over a gain band width of an active waveguide layer with a high controllability.

The above and other objects, effects, features and advantages of the present invention will become more apparent from the following description of embodiments thereof taken in conjunction with the accompanying drawings.

DETAILED DESCRIPTION OF THE INVENTION

Hereinafter, the present invention will be described in detail with reference to the accompanying drawings showing embodiments.

Figure 1A:
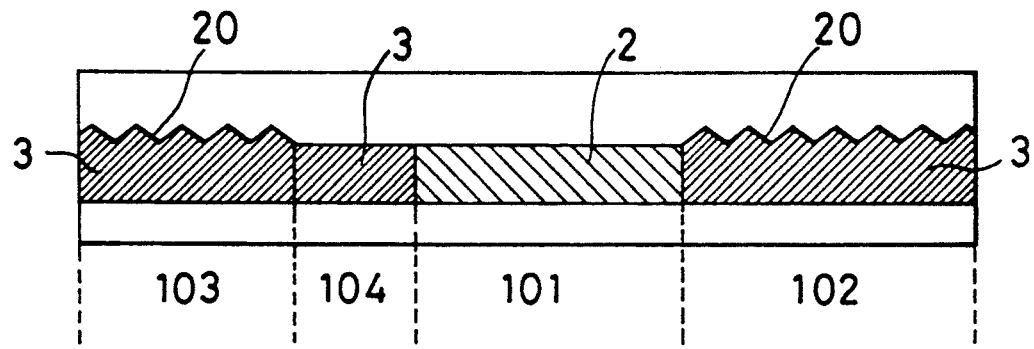
FIG. 1A is a schematic cross-sectional view showing a basic structure of a wavelength-tunable distributed reflector type semiconductor laser according to a first conventional example.
Figure 1B:
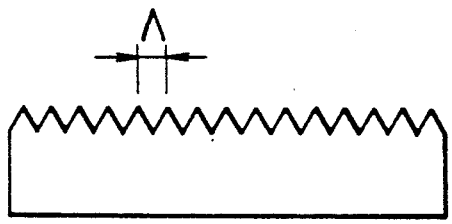
FIG. 1B is a schematic cross-sectional view showing a part of the wavelength-tunable distributed reflector type semiconductor laser shown in FIG. 1A.
Figure 1C:
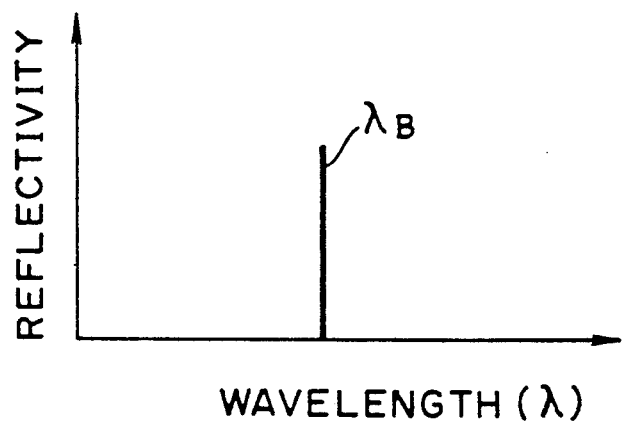
FIG. 1C is a graph illustrating relationship of wavelength vs. reflectivity of the wavelength-tunable distributed reflector type semiconductor laser shown in FIG. 1A.
Figure 2A:
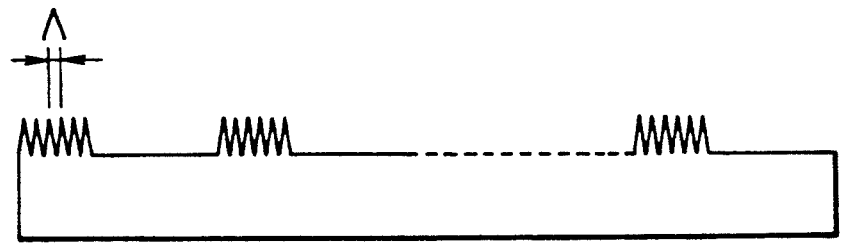
FIG. 2A is a schematic cross-sectional view showing a diffractive grating of a distributed reflector according to a second conventional example.
Figure 2B:
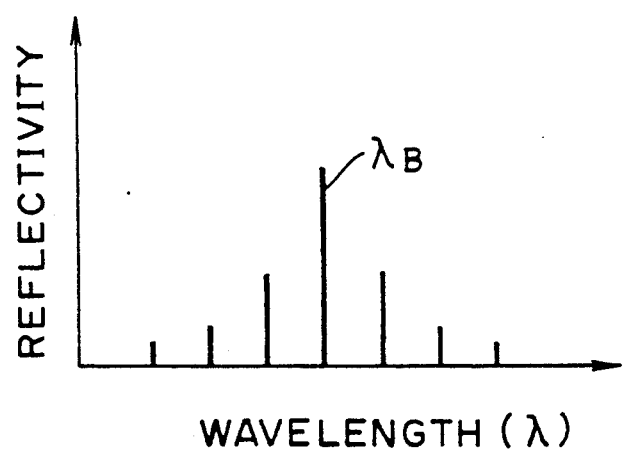
FIG. 2B is a graph illustrating reflectivity characteristics of a distributed reflector according to a second conventional example.
Figure 3A:
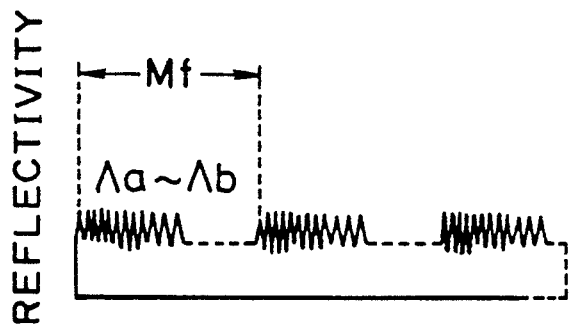
FIG. 3A is a schematic cross-sectional view showing a diffractive grating of a distributed reflector according to a first embodiment of the present invention.
Figure 3B:
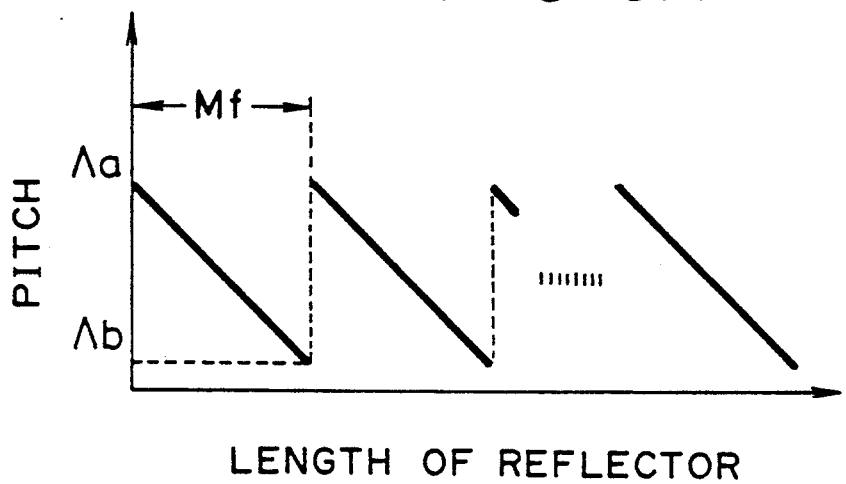
FIG. 3B is an enlarged view showing details of a diffractive grating of a distributed reflector according to a first embodiment of the present invention.
Figure 3C:
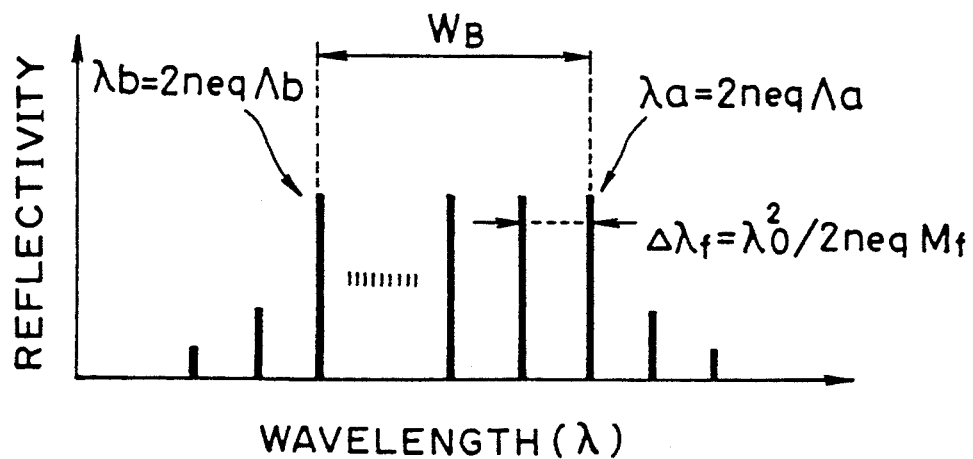
FIG. 3C is a graph illustrating reflectivity characteristics of a distributed reflector according to a first embodiment of the present invention.

A distributed reflector according to a first embodiment of the present invention includes a diffractive grating formed on an optical waveguide. The diffractive grating has a unit region repeated at a period $M_f$. This period $M_f$ is sometimes referred to herein also as modulation period. In each period $M_f$, the pitch of the diffractive grating varies continuously or at intervals from $\Lambda_a$ to $\Lambda_b$ (provided that $M_f > \Lambda_a$, $\Lambda_b$) as shown in FIGS. 3A and 3B where broken lines indicate portions whose depiction has been omitted for convenience's sake. In this case, as shown in FIG. 3C where broken lines indicate portions whose depiction has been omitted for convenience's sake, the distributed reflector has reflectivity characteristics such that multiple sharp high reflectivity peaks appear in a band, $W_B$, of from $\lambda_a$ ($=2\Lambda_a n_{eq}$) to $\lambda b$ ($=2\Lambda_b n_{eq}$) at a period approximately defined by a wavelength spacing of $\Delta\lambda_f = \lambda_0^2/2n_{eq}M_f$ ($\lambda_0 = n_{eq}(\Lambda_a + \Lambda_b)$).

Figure 4A:
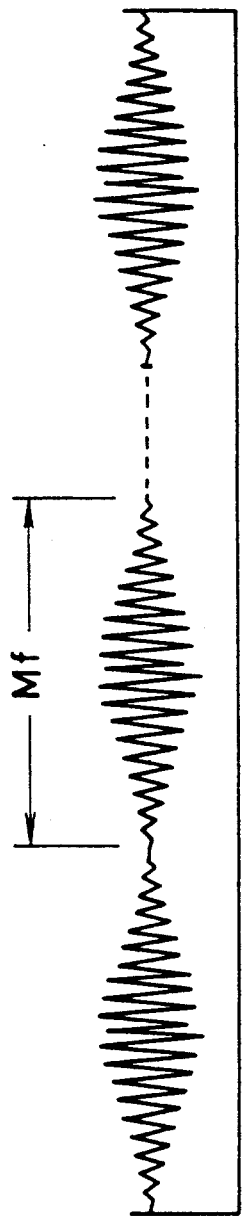
FIG. 4A is a schematic cross-sectional view showing a diffractive grating of a distributed reflector according to a second embodiment of the present invention.
Figure 4B:
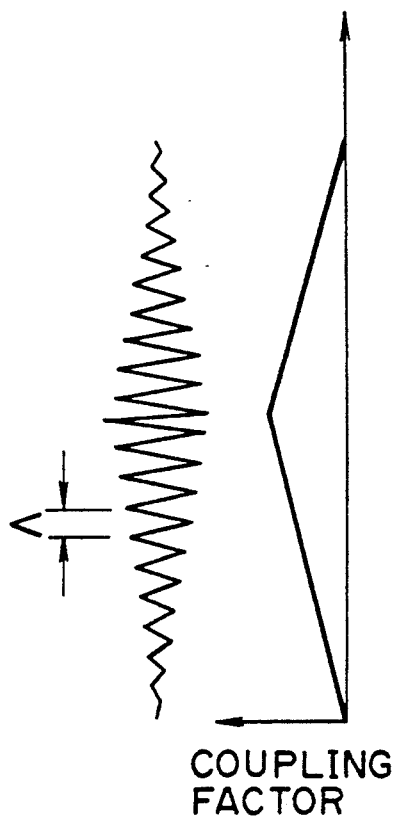
FIG. 4B is an enlarged view showing details of a diffractive grating of a distributed reflector according to a second embodiment of the present invention.
Figure 4C:
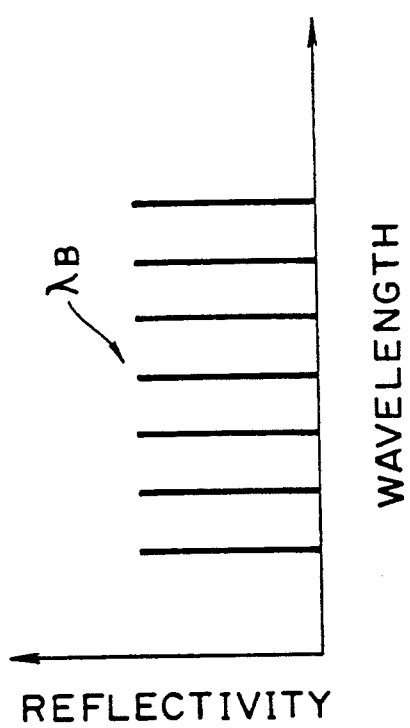
FIG. 4C is a graph illustrating reflectivity characteristics of a distributed reflector according to a second embodiment of the present invention.
Figure 4D:
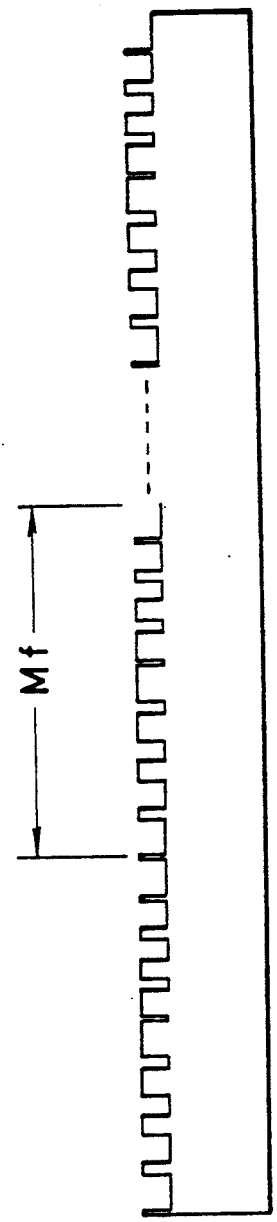
FIG. 4D is a schematic cross-sectional view showing diffractive grating of a distributed reflector according to a second embodiment of the present invention.

A distributed reflector according to a second embodiment of the present invention includes a diffractive grating formed on an optical waveguide at a constant pitch, $\Lambda$. In this case, the depth of the diffractive grating varies continuously or at intervals at a modulation period of $M_f$. In other words, it is a distributed reflector whose coupling coefficient $\kappa$ varies continuously or at intervals at a modulation period of $M_f$ as shown in FIGS. 4A and 4B where broken lines indicate portions whose depiction has been omitted for convenience's sake. Such a periodical structure having a coupling coefficient of $\kappa$ gives rise to multiple reflections between adjacent repeating unit regions. As a result, the distributed reflector has reflectivity characteristics such that in the vicinity of Bragg wavelength determined as a function of the pitch, $\Lambda$, there appear multiple sharp high reflectivity peaks arranged at a period approximately defined by a wavelength spacing of $\Delta\lambda_f = \lambda_0^2/2n_{eq}M_f (\lambda_0 = 2n_{eq}\Lambda)$. The coupling efficiency, $\kappa$, may also change with similar effects as the peak-to-valley ratio (duty of the peak ratio) of the diffractive grating varies as shown, for example, in FIG. 4D where broken lines indicate portions whose depiction has been omitted for convenience's sake.

Figure 5A:
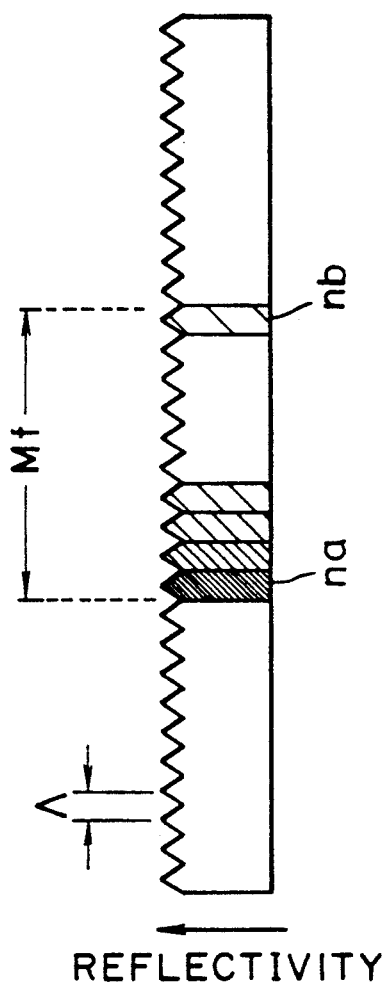
FIG. 5A is a schematic cross-sectional view showing a diffractive grating of a distributed reflector according to a third embodiment of the present invention.
Figure 5B:
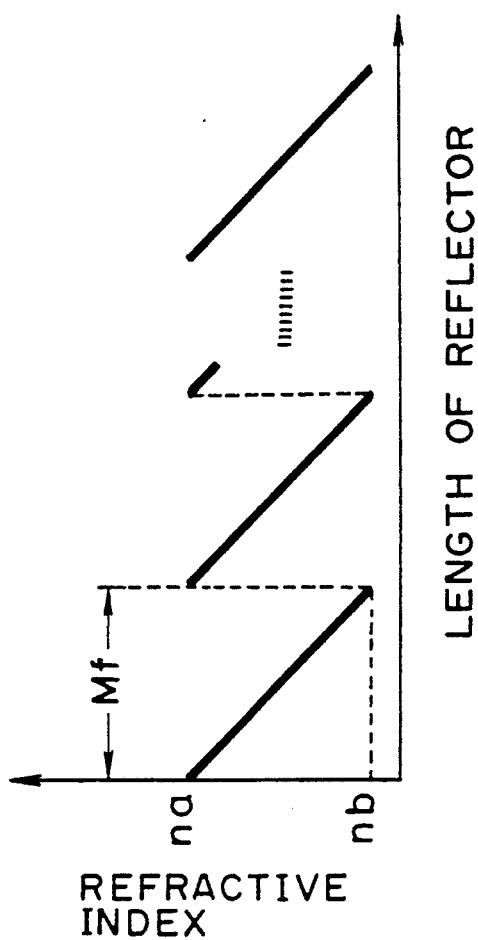
FIG. 5B is an enlarged view showing details of a diffractive grating of a distributed reflector according to a third embodiment of the present invention.
Figure 5C:
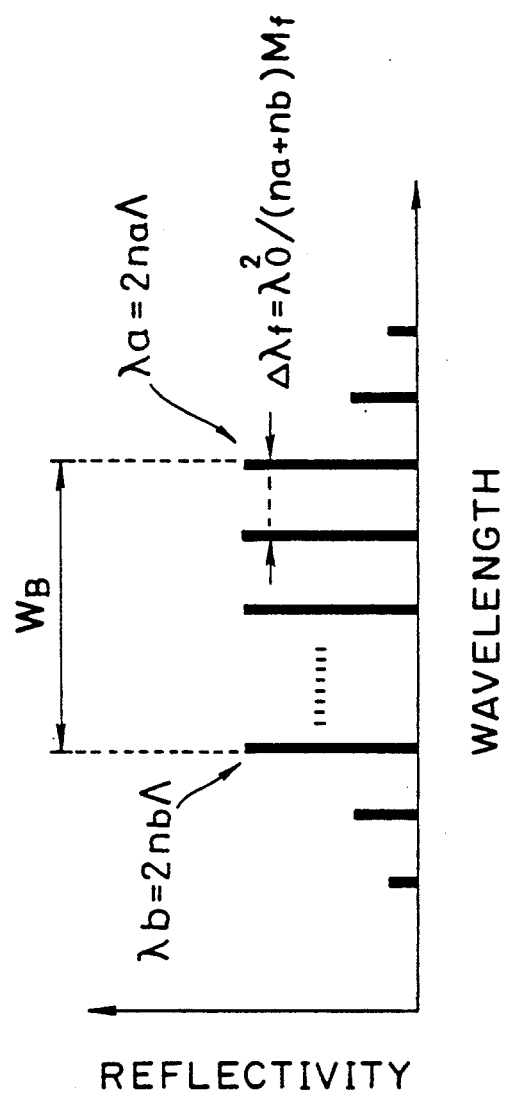
FIG. 5C is a graph illustrating reflectivity characteristics of a distributed reflector according to a third embodiment of the present invention.

A distributed reflector according to a third embodiment of the present invention, designed to obtain similar effects as described above with a uniform pitch, $\Lambda$, includes a diffractive grating formed on an optical waveguide and having a regular, periodical serrate pattern having a pitch of $\Lambda$ as shown in FIG. 5A. In this embodiment, as shown in FIG. 5A, the optical waveguide includes a plurality of repeating unit regions repeated at a period of $M_f$, in each of which the composition of the optical waveguide varies, in the direction in which light transmits, continuously or at intervals from $g_a$ to $g_b$. This structure gives rise to a plurality of repeating unit regions repeated at a period of $M_f$, in each of which equivalent refractive index varies, in the direction in which light transmits, continuously or at intervals from $n_a$ to $n_b$ correspondingly as shown in FIG. 5B where broken lines indicate portions whose depiction has been omitted for convenience's sake. The distributed reflector of this embodiment has reflectivity characteristics such that multiple sharp high reflectivity peaks appear in a wavelength band, $W_B$, ranging from wavelengths $\lambda_a (=2\Lambda_a n_{eq})$ to $\lambda_b (=2\Lambda_b n_{eq})$ at a period approximately defined by a wavelength spacing of $\Delta\lambda_f = \lambda_0^2/(n_a+n_b)M_f (\lambda_0 = (n_a+n_b)\Lambda)$ as shown in FIG. 5C where broken lines indicate portions whose depiction has been omitted for convenience's sake.

Figures 6A, 6B:
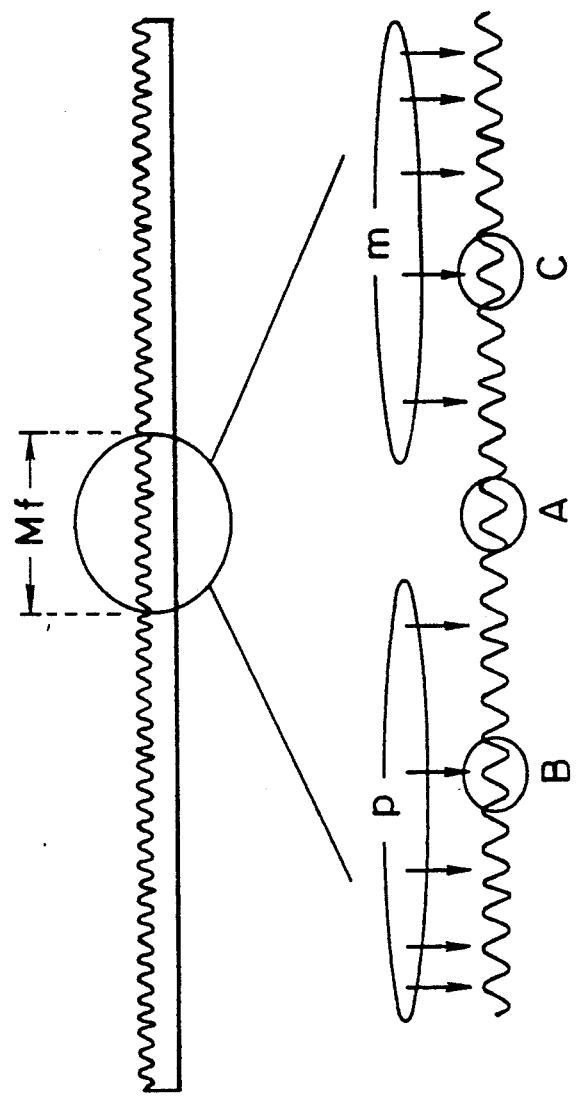
FIG. 6A is a schematic cross-sectional view showing a diffractive grating of a distributed reflector according to a fourth embodiment of the present invention.
FIG. 6B is an enlarged view showing details of a diffractive grating of a distributed reflector according to a fourth embodiment of the present invention.

A distributed reflector according to a fourth embodiment of the present invention includes a diffractive grating formed on an optical waveguide, in which the diffractive grating mostly comprises a regular, periodical pattern having a uniform pitch in which a plurality of phase shifts are introduced. More specifically, as shown in FIG. 6A, the diffractive grating has a repeating structure that includes a plurality of repeating unit regions repeated at a period of $M_f$. In each repeating unit region, the diffractive grating has a constant pitch, $\Lambda$, as shown in FIG. 6B. At a certain number of selected positions in a single repeating unit region, pitches are different from other positions, or the gratings at the selected positions have longer or shorter pitches than those at positions other than the selected ones. Before and after the selected positions, the phase of the refractive index of the diffractive grating changes to "−" or "+", thus forming a phase control region, as shown in FIG. 6B, in which portions indicated by symbols "p" and "m" indicate regions containing "+" and "−" phase shifts, respectively, and arrows indicate respective positions where phase shifts are present.

Figure 6C:
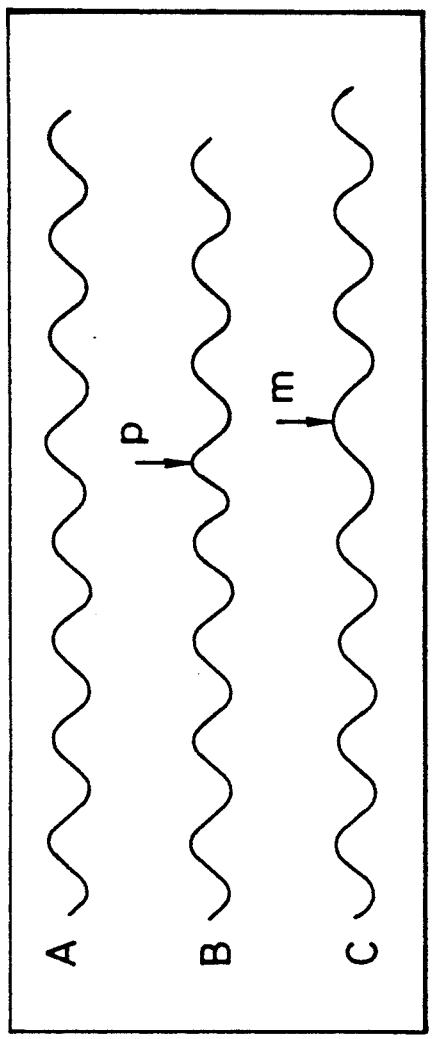
FIG. 6C is a diagram illustrating a pattern of a diffractive grating of a distributed reflector according to a fourth embodiment of the present invention.

FIG. 6C is an enlarged view showing portions of the diffractive grating indicated by symbols A, B and C, respectively, in FIG. 6B. In the portion A, the diffractive grating has a constant pitch. In the portion B, a grating having a smaller pitch than that of the portion A is formed for only a single pitch in a central position thereof. Peak positions of the diffractive grating after this point (toward the right hand side) are shifted forward (toward the left hand side) as compared with those of the diffractive grating in the portion A. This phase shift results in phase modulation of the diffractive grating, so that effects can be obtained which are equivalent to those obtainable with a shorter pitch of the diffractive grating. On the other hand, in the portion C, a grating having a larger pitch than that of the portion A is formed for only a single pitch in a central position thereof. Peak positions of the diffractive grating after this point (toward the right hand side) are shifted rearward (toward the right hand side) as compared with those of the diffractive grating in the portion A in contrast to the case of the portion B. As a result of this phase shift, effects can be obtained which are equivalent to those obtainable with a large pitch of the diffractive grating. The spacing at which phase shifts are inserted varies depending on their position in each repeating unit region as illustrated in FIG. 6B. In addition, the phase shifts inserted in a region ranging from the central position toward the left hand side form "+" shifts while those in a region ranging from the central position toward the right hand side form "−" shifts, thus giving effects equivalent to those obtainable with a pitch increasing gradually in each repeating unit region.

Figure 6D:
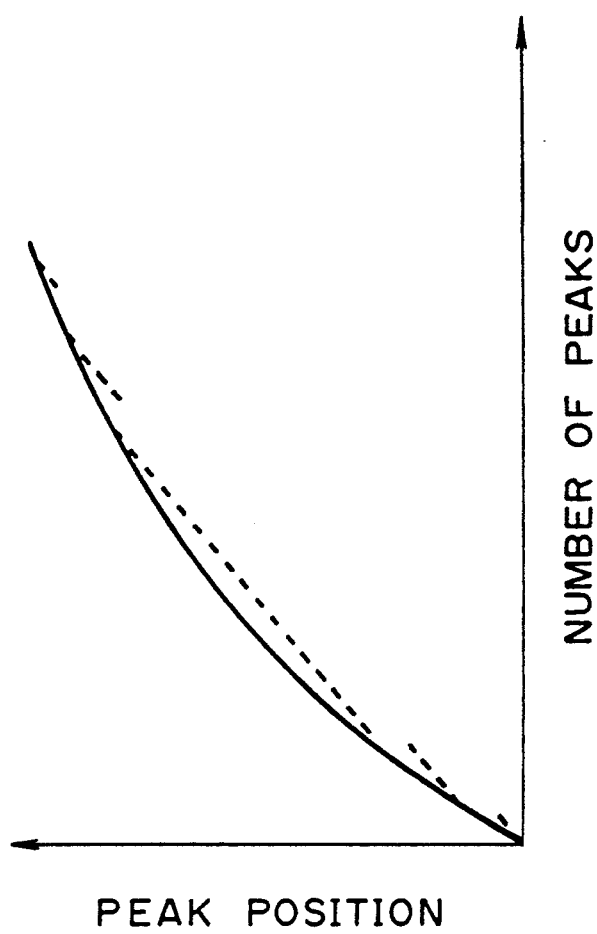
FIG. 6D is a graph illustrating positions of reflectivity peaks of a diffractive grating of a distributed reflector according to a fourth embodiment of the present invention.

FIG. 6D is a graph plotting the position of the peak of an n-th diffractive grating in a repeating unit region vs. number of peaks, n. In FIG. 6D, solid line corresponds to the reflector according to the first embodiment of the present invention described above (hereinafter, referred to as reflector 1) in which the pitch varies in each repeating unit region, and a broken line indicates a diffractive grating of the instant embodiment. In the diffractive grating of the reflector 1, the pitch decreases continuously and therefore the slope of the curve becomes gentler so that generally the curve represents a parabola. On the other hand, when the pitch of a diffractive grating is constant, the position of the peak increases linearly with n. In this case, while peak positions are on a straight line in a sub region where no phase shift is inserted since the pitch is constant, the slope changes discontinuously at an inserted phase shift. Generally, the straight lines bear a close resemblance to the curve of the diffractive grating of the reflector 1. Hence, if the size of the phase shift and the spacing at which phase shifts are inserted are set up small enough, the solid line and the broken line substantially coincide with each other so that the diffractive grating used in the reflector of the instant reflector can exhibit reflectivity characteristics equivalent to those of the diffractive grating of reflector 1. Therefore, the reflector of the instant embodiment has reflectivity characteristics such that in the vicinity of Bragg wavelength approximately defined by the pitch $\Lambda$, there appear multiple sharp high reflectivity peaks at a period approximately defined by a wavelength spacing of $\Delta\lambda_f = \lambda_0^2/2n_{eq}M_f$.

In the case of the reflector of the instant embodiment, since the grating has generally a constant pitch and it is sufficient to insert phase shifts partly or at only selected positions, time required for forming a pattern of diffractive grating using electron beams can be reduced considerably as compared with the diffractive grating of the reflector 1 in which the pitch varies. In addition, in the reflector of the instant embodiment, there is no need for modulating the coupling coefficient, $\kappa$, of the reflector or the composition of the optical waveguide, which facilitates its fabrication in contrast to reflectors according to the second and third embodiments described above.

Now, explanation will be made on wavelength-tunable semiconductor lasers of the present invention.

The wavelength-tunable semiconductor laser of the present invention may be of a distributed reflection type or a distributed feed back type. In the both cases, the semiconductor laser includes two distributed reflectors which have different structures one from another.

Figure 7A:
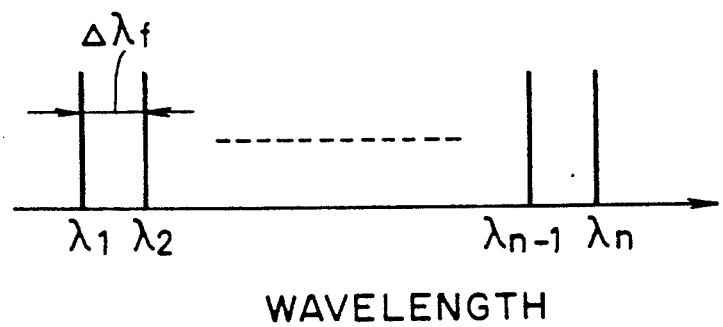
FIGS. 7A and 7B each are schematic diagrams illustrating positions of reflectivity peaks of a diffractive grating of a distributed reflector according to the present invention.
Figure 7B:
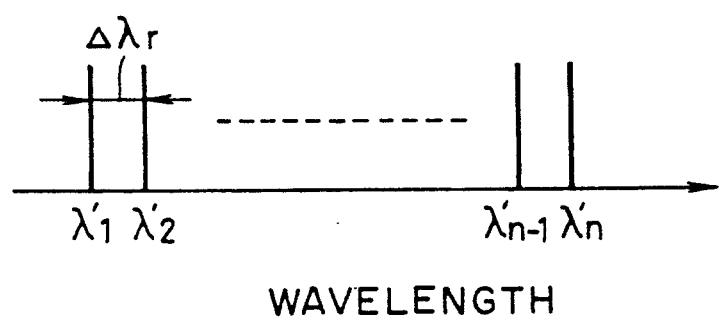

Wavelengths at high reflectivity peaks of one of the two reflectors used in a semiconductor laser of the present invention are named $\lambda_1$ to $\lambda_n$ as illustrated in FIG. 7A for convenience's sake. The reflectivity characteristics of the other of the two reflectors are such that multiple sharp high reflectivity peaks $\lambda'_1$ to $\lambda'_n$ (FIG. 7B) appear in a band ranging from wavelengths $\lambda'_a = 2\Lambda'_a n_{eq}$ to $\lambda'_b = 2\Lambda'_b n_{eq}$ at wavelength spacing of $\Delta\lambda_r = \lambda'_0{}^2/2n_{eq}M_r$ ($\lambda'_0 = n_{eq}(\Lambda'_a + \Lambda'_b)$). Here, according to a fifth embodiment of the present invention using the reflectors of the first embodiment, the two distributed reflector regions include diffractive gratings which have different pitch modulation periods $M_f$ and $M_r$ ($M_f \neq M_r$).

Figure 7C:
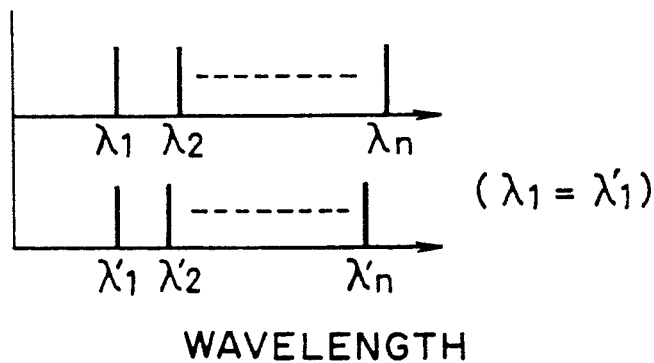
FIGS. 7C and 7D each are schematic diagrams illustrating positions of reflectivity peaks of diffractive gratings of two distributed reflectors according to the present invention.
Figure 7D:
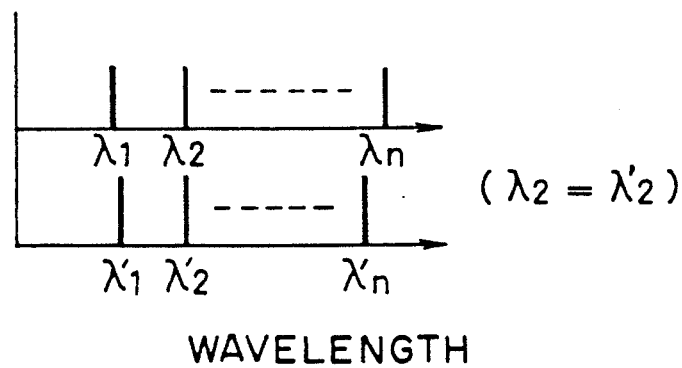

In the wavelength-tunable semiconductor laser of the present invention, the two different distributed reflector regions are controlled electrically independently of each other so that one of wavelengths $\lambda'_1$ to $\lambda'_n$ can coincide with one wavelength $\lambda_i$ (i=1 to n) among wavelengths $\lambda_1$ to $\lambda_n$, and laser emission can occur only at a wavelength in the vicinity of $\lambda_i$. FIGS. 7C and 7D illustrate laser emissions at wavelengths around $\lambda_1$ and $\lambda_2$ (i.e., i=1 or 2), respectively. In the case where $\lambda_1$ to $\lambda_n$, $\lambda'_1$ to $\lambda'_n$, and $\lambda''_1$ to $\lambda''_n$, are set up so that gain band of the semiconductor can be covered, control of lasing wavelength covering the gain band can be realized. The above-described diffractive grating may be formed in a distributed reflector type semiconductor laser having an active region and two inactive regions sandwiching the active region, with the diffractive grating being formed in the inactive regions, or in a distributed feed back type semiconductor laser whose resonator is constructed by an active region alone, with the diffractive grating being formed in the active region.

Furthermore, a phase adjustment region where no diffractive grating is formed may be provided in the inactive region of the optical waveguide of the distributed reflector type semiconductor laser, and the refractive index of the phase adjustment region may be controlled independently of the above-described distributed reflector region. This enables fine adjustment of lasing wavelength in the vicinity of the aforementioned wavelength $\lambda_i$, so that lasing can occur over the entire band ranging from wavelengths $\lambda_1$ to $\lambda_2$.

Still further, a phase adjustment region where no diffractive grating is formed may be provided in the active region of the optical waveguide of the distributed feed back type semiconductor laser, and the refractive index of the phase adjustment region may be controlled independently of the aforementioned distributed reflector region. In this case, it is possible to achieve fine adjustment of lasing wavelength in the vicinity of the aforementioned wavelength $\lambda_i$, so that lasing can occur over the entire band ranging from wavelengths $\lambda_1$ to $\lambda_2$.

The distributed reflector type semiconductor laser of the present invention may include two sets of comb-shaped electrodes above the two distributed reflectors, i.e., front and rear distributed reflectors, and current may be injected or voltage may be applied to each of them independently. This can change average equivalent refractive indices of the front and rear distributed reflectors independently so that lasing can occur at a wavelength in the vicinity of any selected wavelength $\lambda_i$. Changing the average refractive indices of the front and rear distributed reflectors by the same amount simultaneously enables fine adjustment of lasing wavelength around the aforementioned wavelength $\lambda_i$. In the distributed reflector type semiconductor laser, the rest two electrodes of the aforementioned comb-shaped electrodes may be earthed, and current may be injected or voltage may be applied to the electrodes. This enables fine adjustment of lasing wavelength around $\lambda_i$. Furthermore, in the distributed reflector type semiconductor laser, it enables continuous tuning of lasing wavelength around the wavelength $\lambda_i$ to inject current or apply voltage simultaneously to the aforementioned earthed comb-shaped electrodes and the inactive region of the optical waveguide where no diffractive grating is present.

Also the distributed feed back type semiconductor laser of the present invention may include two sets of comb-shaped electrodes above the front and rear distributed reflectors, and current may similarly be injected to each of the comb-shaped electrodes independently, with varying its intensity. As a result the average equivalent refractive indices of the front and rear distributed reflectors can be changed independently so that lasing can occur at a wavelength in the vicinity of any selected wavelength $\lambda_i$. Simultaneous change in the average refractive indices of the front and rear distributed reflectors by the same amount makes it possible to conduct fine adjustment of lasing wavelength around the aforementioned wavelength $\lambda_i$. In the distributed feed back type semiconductor laser, the rest two electrodes of the aforementioned comb-shaped electrodes may be earthed and current may be injected to the electrodes to thereby enable fine adjustment of lasing wavelength around $\lambda_i$. Furthermore, in the distributed feed back type semiconductor laser, simultaneous change in current injected to the aforementioned earthed comb-shaped electrodes and that injected to the active region of the optical waveguide where no diffractive grating is present enables continuous tuning of lasing wavelength around the wavelength $\lambda_i$.

To control the refractive index of the resonator, the semiconductor laser has externally attached thereto an electrical control device which is electrically connected via a conductor to each of the electrodes provided on the semiconductor laser and provides controlled current or voltage. The electrical control device is not limited particularly, and any conventional ones can be used so far as they can provide controlled current or voltage.

As described above, lasing can occur at any desired wavelength in a band ranging from wavelengths $\lambda_1$ to $\lambda_n$. In addition, setting the wavelengths $\lambda_1$ to $\lambda_n$, $\lambda'_1$ to $\lambda'_n$, and $\lambda''_1$ to $\lambda''_n$, at values such that gain band of the semiconductor laser can be covered enables lasing at any desired wavelength within the range of the gain band.

EXAMPLES

Hereafter, the present invention will be described in more detail by examples. However, the invention should not be construed as being limited thereto.

In the following examples, electrical control is realized by the use of an electrical control device as described above. However, for simplicity's sake, description and depiction of the electrical control device are omitted.

EXAMPLE 1

Figure 8:
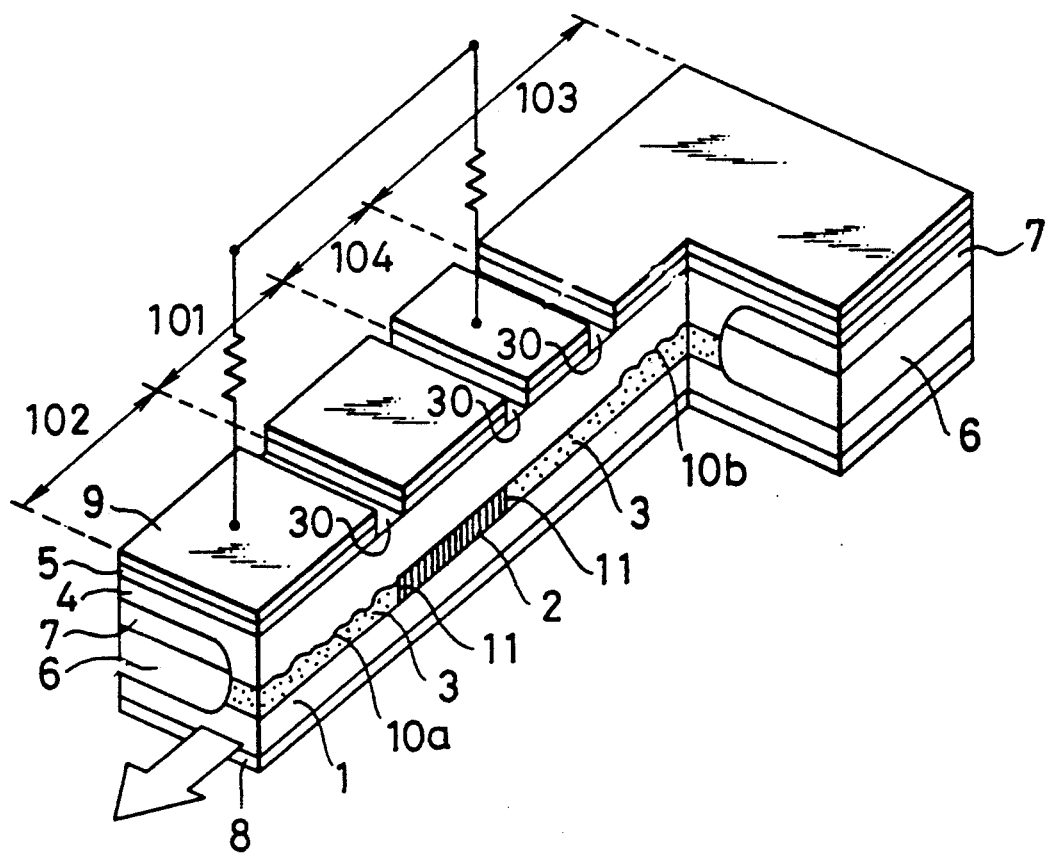
FIG. 8 is a schematic cross-sectional perspective view showing a wavelength-tunable semiconductor laser of the present invention.

FIG. 8 is a schematic cross-sectional perspective view showing a wavelength-tunable semiconductor laser of a distributed reflector type according to a first example of the present invention. In FIG. 8, reference numeral 1 denotes an n-type InP substrate, 2 an InGaAsP active waveguide layer having a bandgap wavelength of 1.55 μm, 3 an InGAsP inactive waveguide layer having a bandgap wavelength of 1.3 μm, 4 a p-type InP cladding layer, 5 a p+-type InGaAsP cap layer, 6 a p-type InP current block layer, 7 an n-type current block layer, 8 an n-type electrode, 9 a p-type electrode, 10a a first or front diffractive grating including repeating unit regions repeated at a period of $M_f$, each of the repeating unit regions having a pitch intermittently varying from $\Lambda_a$ to $\Lambda_b$, 10b a second or rear diffractive grating including repeating unit regions at a period of $M_r$, each of the repeating unit region having a pitch intermittently varying from $\Lambda'_a$ to $\Lambda'_b$, 11 a connection portion connecting an active waveguide layer and an inactive waveguide layer, 30 grooves, 101 an active layer, 102 a first or front distributed reflector region, 103 a second or rear distributed reflector region, and 104 a phase adjustment region. Here, the diffractive grating 10 is one according to the first embodiment described above. However, diffractive gratings according to the second to fourth embodiments may also be used with similar effects.

The distributed reflector type semiconductor laser of the instant example can be fabricated as follows. First, the active waveguide layer 2 and the inactive waveguide layer 3 are formed on the n-type InP substrate 1 by an organic metal gas phase epitaxial growth method. Then, a resist is coated on a surface of the inactive waveguide layer 3, and a pattern of a diffractive grating having a modulated pitch is transferred on the resist by an electron beam exposure. The diffractive gratings 10a and 10b are formed by etching using the transferred pattern as a mask. Then, in order to control transverse modes, the waveguides are processed into stripes. The p-type InP current block layer 6, the n-type current block layer 7, the p-type InP cladding layer 4, and the p+-type InGaAs cap layer 5 are formed one on another in this order. Thereafter, the p-type electrode 9 and the n-type electrode 8 are formed thereon. further, the p-type electrode 9 and the p+-type InGaAsP cap layer 5 are partially removed to form grooves 30, which electrically separate the semiconductor into an active region 101 that includes the active waveguide layer 2, a first or front distributed reflector region 102 including the diffractive grating 10a, a second or rear distributed reflector region 103 including the diffractive grating 10b, a phase adjustment region 104 including the inactive waveguide layer that has no diffractive grating. The grooves 30 are above portions of the semiconductor laser corresponding to connection portions that connect adjacent two of these regions.

In the diffractive grating used in the wavelength-tunable distributed reflector type semiconductor laser according to the instant example, the repeating unit region of which the pitch of the diffractive grating 10a intermittently varies from 2459 Å to 2389 Å is repeated at a period of 75 μm while the repeating unit region of which the pitch of the diffractive grating 10b intermittently varies from 2454 Å to 2385 Å is repeated at a period of 67.5 μm.

Figure 9:
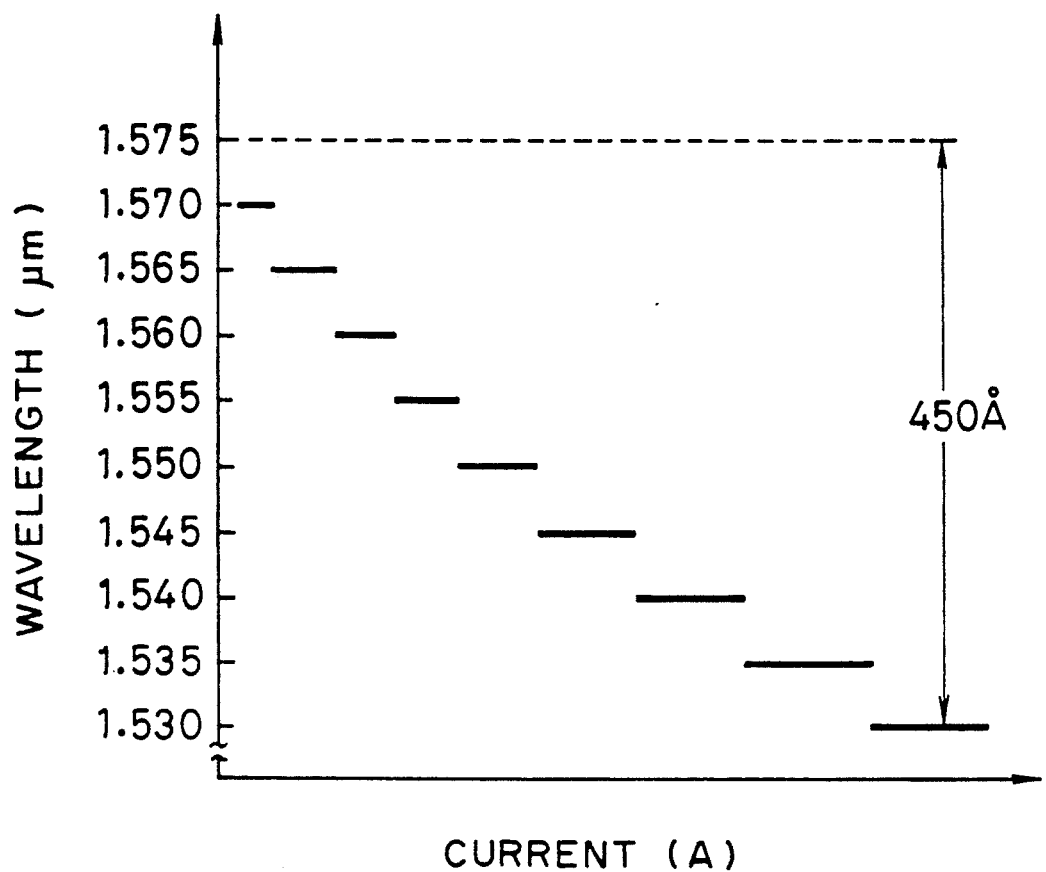
FIG. 9 is a graph illustrating lasing characteristics of a distributed reflector type semiconductor laser according to a first example of the present invention.

The distributed reflector type semiconductor laser having the above-described construction lases upon application of current to the active region 101 thereof, and the lasing wavelength can be controlled by applying current or voltage separately to the distributed reflector regions 102 and 103, and the phase adjustment region 104. FIG. 9 is a graph illustrating change of lasing wavelength when current to be applied to the distributed reflector region 103 varies in a state where a constant current is applied to the active region 101, with applying no current to the distributed reflector region 102 and the phase adjustment region 104. As illustrated in FIG. 9, in the distributed reflector type semiconductor laser of the instant example, application of current to the distributed reflector region 103 results in change of lasing wavelength from 1.575 μm to 1.530 μm at an interval of about 50 μm, thus giving a maximum wavelength tuning of 450 Å. Then, application of independently controlled currents to the distributed reflector region 102 and the phase adjustment region 104, respectively, can vary lasing wavelength over the entire bandwidth of 450 Å.

In the instant example, while explanation has been made on the case where the active waveguide layer and the inactive waveguide layer constitute a single semiconductor layer, the present invention is applicable to a laminated semiconductor including a plurality of semiconductor layers having different compositions such as an MQWS (multi-quantum well structure) laser.

Table 1 shows relationship between the pitch of the diffractive grating used in the semiconductor laser of the instant example with Bragg wavelength when no control current is applied.

TABLE 1

| Front DBR Region | | | Rear DBR Region | | |
|---|---|---|---|---|---|
| No. | Pitch (Å) | Bragg Wavelength (μm) | No. | Pitch (Å) | Bragg Wavelength (μm) |
| 1 | 2459 | 1.5748 | 1 | 2454 | 1.5719 |
| 2 | 2451 | 1.5696 | 2 | 2446 | 1.5662 |
| 3 | 2443 | 1.5645 | 3 | 2437 | 1.5605 |
| 4 | 2435 | 1.5594 | 4 | 2428 | 1.5549 |
| 5 | 2427 | 1.5543 | 5 | 2419 | 1.5493 |
| 6 | 2419 | 1.5494 | 6 | 2411 | 1.5438 |
| 7 | 2412 | 1.5444 | 7 | 2402 | 1.5383 |
| 8 | 2404 | 1.5394 | 8 | 2394 | 1.5329 |
| 9 | 2396 | 1.5345 | 9 | 2385 | 1.5275 |
| 10 | 2389 | 1.5296 | | | |

EXAMPLE 2

Figure 10A:
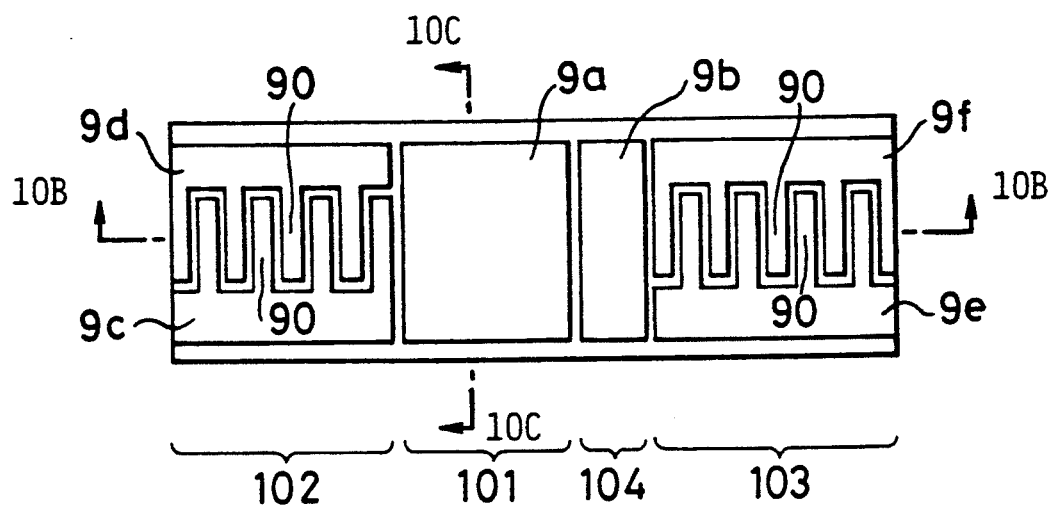
FIG. 10A is a plan view showing a wavelength-tunable semiconductor laser according to a second example of the present invention.
Figure 10B:
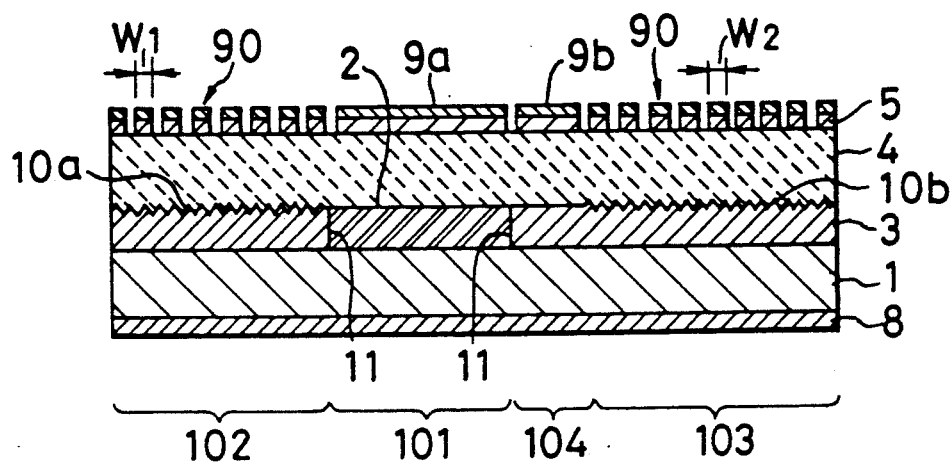
FIG. 10B is a cross-sectional view taken along the line 10B—10B in FIG. 10A, showing a wavelength-tunable semiconductor laser according to a second example of the present invention.
Figure 10C:
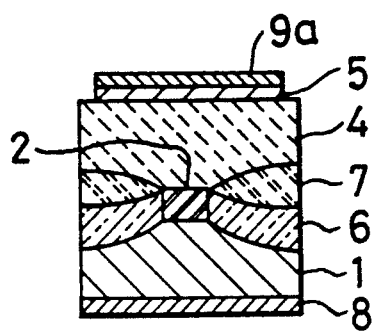
FIG. 10C is a cross-sectional view taken along the line 10C—10C in FIG. 10A, showing a wavelength-tunable semiconductor laser according to a second example of the present invention.

FIGS. 10A to 10C are schematic views showing a wavelength-tunable distributed reflector type semiconductor laser according to a second example of the present invention. FIG. 10A is a schematic plan view showing the distributed reflector type semiconductor laser of the instant example. FIG. 10B is a schematic cross-sectional view taken along the line 10B—10B, showing the distributed reflector type semiconductor laser shown in FIG. 10A, and FIG. 10C is a schematic cross-sectional view taken along the line 10C—10C, showing the distributed reflector type semiconductor laser shown in FIG. 10A. In FIGS. 10A to 10C, reference numerals 1 to 8, 10a, 10b, 11, 30, and 101 to 104 are the same as in FIG. 8, and 9a denotes a p-type electrode provided in the active region 101, 9b a p-type electrode provided in the phase adjustment region 104, 9c and 9d a set of comb-shaped p-type electrodes provided in the front distributed reflector region 102, 9e and 9f a set of comb-shaped p-type electrodes provided in the rear distributed reflector region 103, and 90 teeth of the comb-shaped electrodes. Here, the diffractive grating 10 is one according to the first embodiment described above. However, diffractive gratings according to the second to fourth embodiments may also be used with similar effects.

The distributed feed back type semiconductor laser of the instant example can be fabricated in a manner similar to Example 4 except that instead of the electrodes 9, the comb-shaped electrodes 9c and 9d, and 9e and 9f are formed in the front and rear distributed reflector regions 102 and 103, respectively.

In the diffractive grating used in the wavelength-tunable distributed feed back type semiconductor laser according to the instant example, the repeating unit region of which the pitch of the diffractive grating 10a intermittently varies from 2459 Å to 2389 Å is repeated at a period of 75 μm while the repeating unit region of which the pitch of the diffractive grating 10b intermittently varies from 2454 Å to 2385 Å is repeated at a period 67.5 μm. Each comb-shaped electrode has a plurality of teeth 90 arranged at the same period as the pitch modulation period. That is, the individual electrodes (teeth) 90 of the comb-shaped electrodes 9c and 9d for the front distributed reflector region 102 are arranged at a period of 75 μm and the width $w_1$ of a single tooth 90 is about half this period (about 37.5 μm). The individual electrodes (teeth) 90 of the comb-shaped electrodes 9e and 9f are arranged at a period of 67.5 μm and the width $w_2$ of a single tooth 90 is about half this period (about 33.75 μm).

The distributed feed back type semiconductor laser having the above-described construction lases upon application of current to all the regions thereof, and the lasing wavelength varies upon application of currents separately and independently to the distributed reflector regions 102 and 103, and the phase adjustment region 104.

Figure 11:
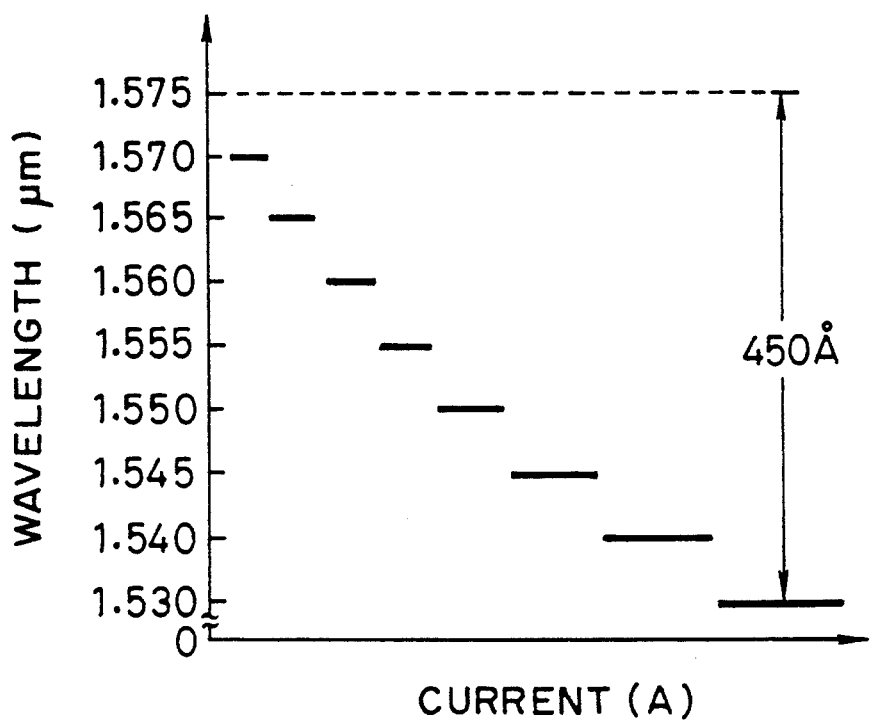
FIG. 11 is a graph illustrating lasing characteristics of a distributed reflector type semiconductor laser according to a first example of the present invention.

FIG. 11 illustrates the variation of lasing wavelength when current applied to the comb-shaped electrode 9e in the distributed reflector region 103 varies under the conditions that a constant current is applied to the active region 101, and no current is applied to the comb-shaped electrodes 9c and 9d in the front distributed reflector region 102, the comb-shaped electrode 9f in the rear distributed reflector region 103 and the p-type electrode 9b in the phase adjustment region 104. As illustrated in FIG. 11, in the distributed reflector type semiconductor laser of the instant example, application of current to the distributed reflector region 103 results in intermittent change of lasing wavelength from 1.575 μm to 1.530 μm at an interval of about 50 μm.

Figure 12:
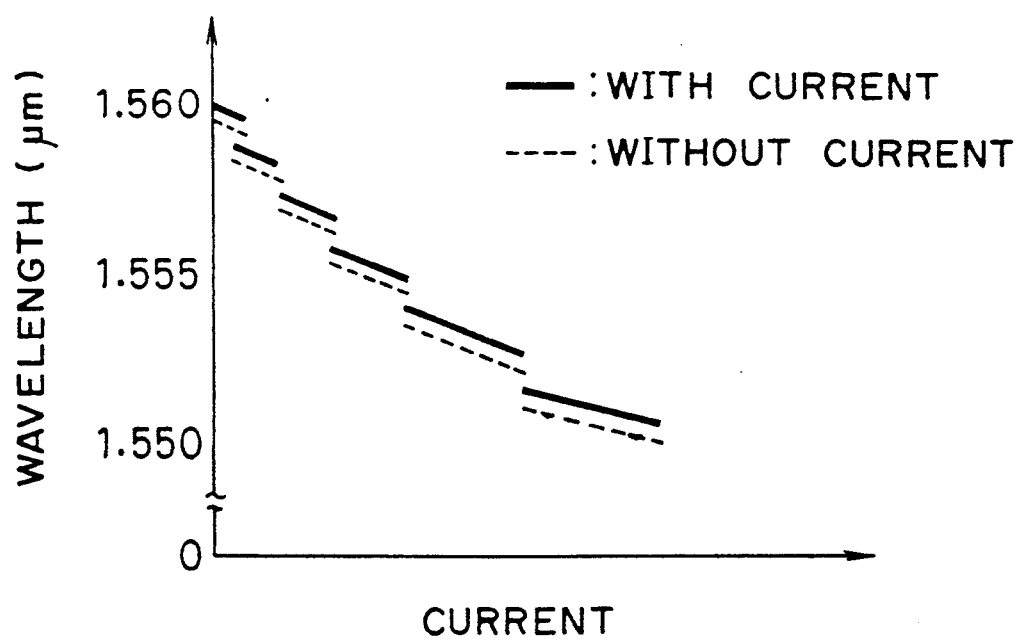
FIG. 12 is a graph illustrating lasing characteristics of a distributed reflector type semiconductor laser according to a second example of the present invention.

Further, it is possible to conduct fine control of the lasing wavelength by independently applying fixed currents to the comb-shaped electrodes 9c and 9e, respectively, selecting one of different lasing wavelengths differing one from another at an interval of about 50 Å, electrically short-circuiting the comb-shaped electrodes 9d and 9f, and applying current to the short-circuited electrodes simultaneously. FIG. 12 is a graph illustrating relationship between variation of lasing wavelength and current. Solid lines in FIG. 12 represent behavior of wavelength when the current applied to the aforementioned short-circuited comb-shaped electrodes 9d and 9f varies. As illustrated in FIG. 12, with the distributed reflector type semiconductor laser, simultaneous application of current to the short-circuited comb-shaped electrodes 9d and 9f results in change in lasing wavelength by about 50 Å with a leap in wavelength.

Further, broken lines in FIG. 12 represent behavior wavelength when current is applied to the p-type electrode 9b provided in the phase adjustment region 104, and the current applied to the short-circuited comb-shaped electrodes 9d and 9f varies. Thus, it is possible to conduct further fine control of the lasing wavelength by controlling the current injected to the p-type electrode 9b in the phase adjustment region.

Adjustment of the currents applied to the p-type electrodes 9b to 9f, respectively, by the aforementioned procedure, enables coarse adjustment and fine adjustment of the lasing wavelength and selection of any desired lasing wavelength from over entire bandwidth of 450 Å.

EXAMPLE 3

Here, explanation will be made on a wavelength-tunable distributed reflector type semiconductor laser according to a third example of the present invention.

In the distributed reflector type semiconductor lasers according to Examples 1 and 2, respectively, of the present invention, the pitch modulation period of the diffractive grating is the same as that at which the individual electrodes or teeth of the comb-shaped electrodes are arranged. When the period of repetition of the individual electrodes of the comb-shaped electrodes is smaller than the pitch modulation period of the diffractive grating, similar effects can be obtained as Examples 1 and 2 above. On the other hand, when the former is larger than the latter, different effects can be obtained. As an example of this, explanation will be made hereinbelow as to how to control lasing wavelength of a semiconductor laser which has the same structure as the wavelength-tunable semiconductor laser described in Example 2 as shown in FIGS. 10A to 10C except that the widths of the individual electrodes of the comb-shaped electrodes 9c to 9f are twice as large as in the case of Example 2.

Figure 13A:
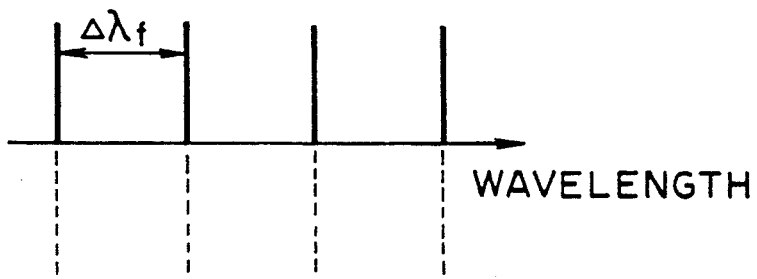
FIGS. 13A, 13B and 13C each are graphs illustrating lasing characteristics of a distributed reflector type semiconductor laser according to a third example of the present invention.
Figure 13B:
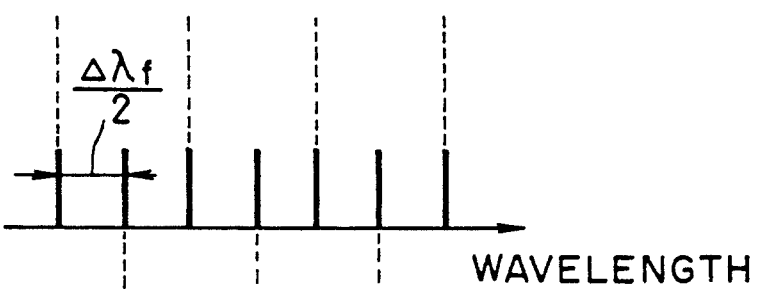
Figure 13C:
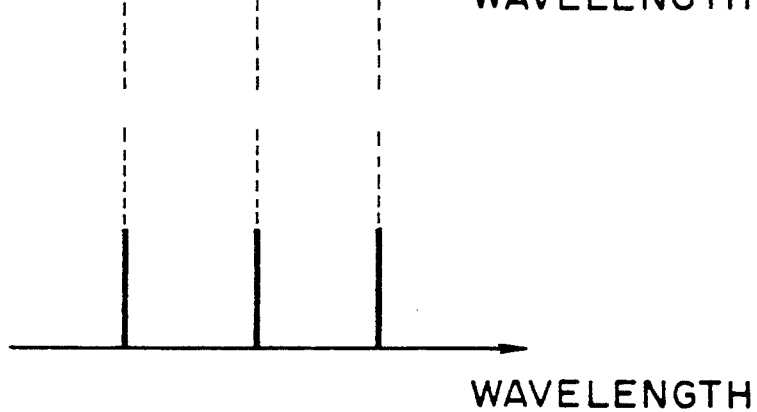

FIGS. 13A to 13C are graphs each illustrating reflectivity characteristics of the distributed reflector region of the semiconductor laser according to the instant embodiment. When no current is applied to the comb-shaped electrodes, the reflectivity characteristics of the distributed reflector region are as illustrated in FIG. 13A. That is, reflectivity peaks appear periodically at a wavelength spacing $\Delta\lambda_f$ approximately defined by the pitch modulation period $M_f$ of the diffractive grating. Here, application of current to one of a set of the comb-shaped electrodes whose individual electrodes or teeth formed above the diffractive grating at a period of $2M_f$ results in variation of the refractive index at a period of $2M_f$, so that the distributed reflector can have reflectivity characteristics such that reflectivity peaks appear periodically at a wavelength spacing of $\Delta\lambda_f/2$ as illustrated in FIG. 13B. Further, when the amount of current to be applied to the electrode increases, reflectivity characteristics changes as if the reflectivity peaks when no current is applied are shifted by an amount of $\Delta\lambda_f/2$. Coarse adjustment of lasing wavelength can be realized at a wavelength spacing of $\Delta\lambda_f/2$ based on this principle. In other words, the semiconductor lasers of Examples 1 and 2 enable coarse adjustment of a lasing wavelength at an interval of 50 Å while the semiconductor laser of the instant examples allows coarse adjustment of a lasing wavelength at an interval of 25 Å.

EXAMPLE 4

Figure 14:
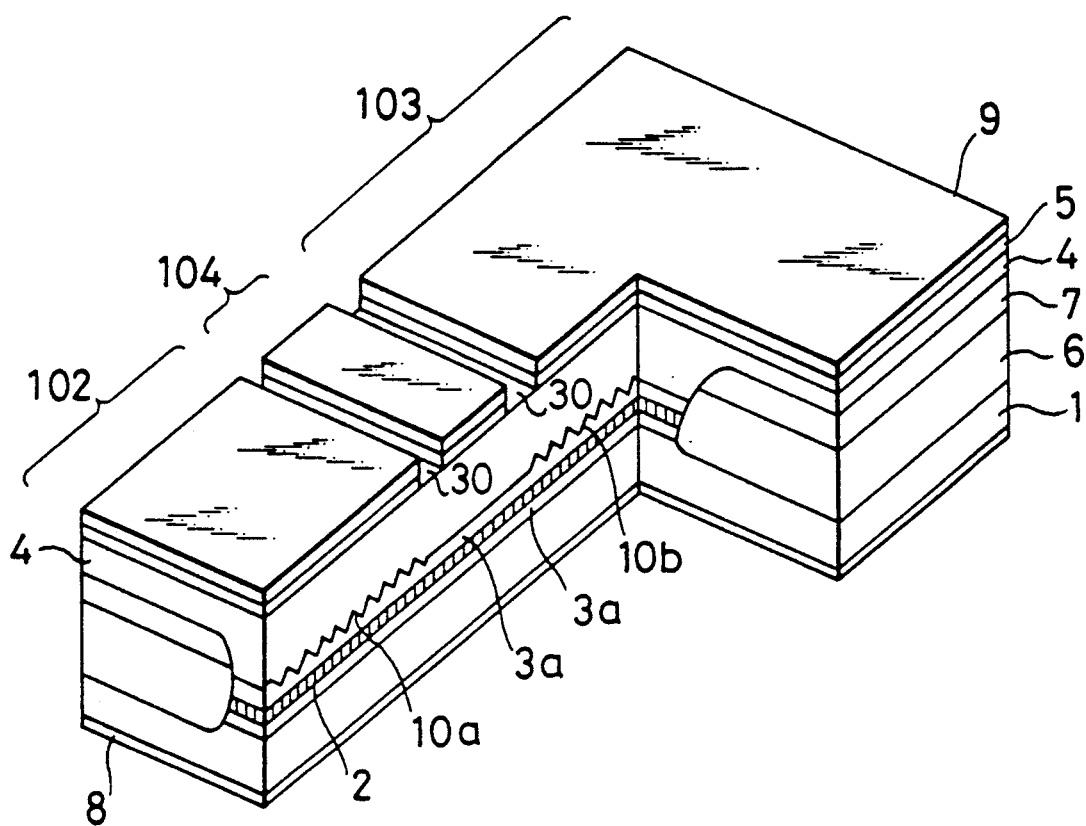
FIG. 14 is a schematic cross-sectional perspective view showing a distributed feed back type semiconductor laser according to a fourth example of the present invention.

FIG. 14 is a schematic cross-sectional perspective view showing a wavelength-tunable distributed feed back type semiconductor laser according to a fourth example of the present invention. In FIG. 14, reference numeral 1 denotes an n-type InP substrate, 2 an In-GaAsP active waveguide layer having a bandgap wavelength of 1.55 μm, 3a an InGAsP optical confinement layer having a bandgap wavelength of 1.3 μm, 4 a p-type InP cladding layer, 5 a p+-type InGaAsP cap layer, 6 a p-type InP current block layer, 7 an n-type current block layer, 8 an n-type electrode, 9 a p-type electrode, 10a a first or front diffractive grating including repeating unit regions repeated at a period of $M_f$, each of the repeating unit regions having a pitch intermittently varying from $\Lambda_a$ to $\Lambda_b$, 10b a second or rear diffractive grating including repeating unit regions at a period of $M_r$, each of the repeating unit region having a pitch intermittently varying from $\Lambda'_a$ to $\Lambda'_b$, 101 an active region, 102 a first or front distributed reflector region, 103 a second or rear distributed reflector region, and 104 a phase adjustment region. Here, the diffractive gratings 10a and 10b are ones according to the first embodiment described above. However, diffractive gratings according to the second to fourth embodiments may also be used with similar effects.

Fabrication of the distributed reflector type semiconductor laser of the instant example will be described briefly. First, the active waveguide layer 2 and the optical confinement layer 3a are formed on the n-type InP substrate 1 by an organic metal gas phase epitaxial growth method. Then, a resist is coated on a surface of the optical confinement layer 3a, and a pattern of a diffractive grating having a modulated pitch is transferred on the resist by an electron beam exposure. The diffractive gratings 10a and 10b are formed by etching using the transferred pattern as a mask. Then, in order to control transverse modes, the waveguides are processed into stripes. The p-type InP current block layer 6, the n-type current block layer 7, the p-type InP cladding layer 4, and the p+-type InGaAs cap layer 5 are formed one on another in this order. Thereafter, the p-type electrode 9 and the n-type electrode 8 are formed thereon in this order. Further, the p-type electrode 9 and the p+-type InGaAsP cap layer 5 are partially removed to form grooves 30, which electrically separate the semiconductor into a first or front distributed reflector region 102 including the diffractive grating 10a, a second or rear distributed reflector region 103 including the diffractive grating 10b, a phase adjustment region 104 including the inactive waveguide layer that has no diffractive grating. The grooves 30 are above portions of the semiconductor laser corresponding to connection portions that connect adjacent two of these regions.

In the diffractive grating used in the wavelength-tunable distributed feed back type semiconductor laser according to the instant example, the repeating unit region of which the pitch of the diffractive grating 10a intermittently varies from 2459 Å to 2389 Å is repeated at a period of 75 μm while the repeating unit region of which the pitch of the diffractive grating 10b intermittently varies from 2454 Å to 2385 Å is repeated at a period 67.5 μm.

The distributed reflector type semiconductor laser having the above-described construction lases upon application of current to each of the regions thereof, and the lasing wavelength can be controlled by varying the currents independently of each other. FIG. 9 is a graph illustrating variation of lasing wavelength when the current applied to the rear distributed reflector region 103 varies in a state where a constant current is applied to each of the front distributed reflector region 102 and the phase adjustment region 104. As illustrated in FIG. 9, in the distributed feed back type semiconductor laser of the instant example, application of current to the distributed reflector region 103 results in change of lasing wavelength from 1.575 μm to 1.530 μm at an interval of about 50 μm, thus giving a maximum wavelength tuning of 450 Å. Then, application of independently controlled currents to the distributed reflector region 102 and the phase adjustment region 104, respectively, can vary lasing wavelength over the entire bandwidth of 450 Å.

In the instant example, while explanation has been made on the case where the active waveguide layer and the inactive waveguide layer constitute a single semiconductor layer, the present invention is applicable to laminated semiconductor including a plurality of semiconductor layers having different compositions such as MQWS (multi-quantum well structure) laser.

EXAMPLE 5

Figure 15A:
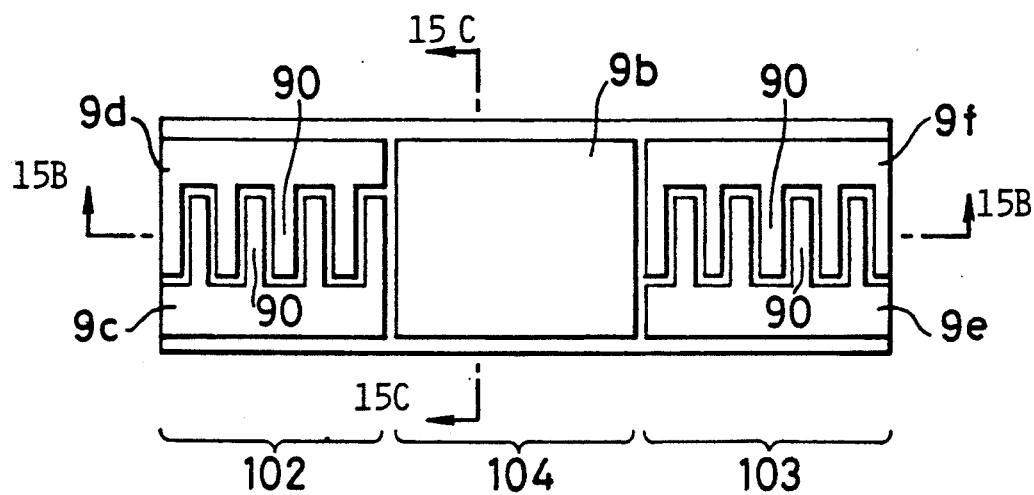
FIG. 15A is a schematic plan view showing a distributed feed back type semiconductor laser according to a fifth example of the present invention.
Figure 15B:
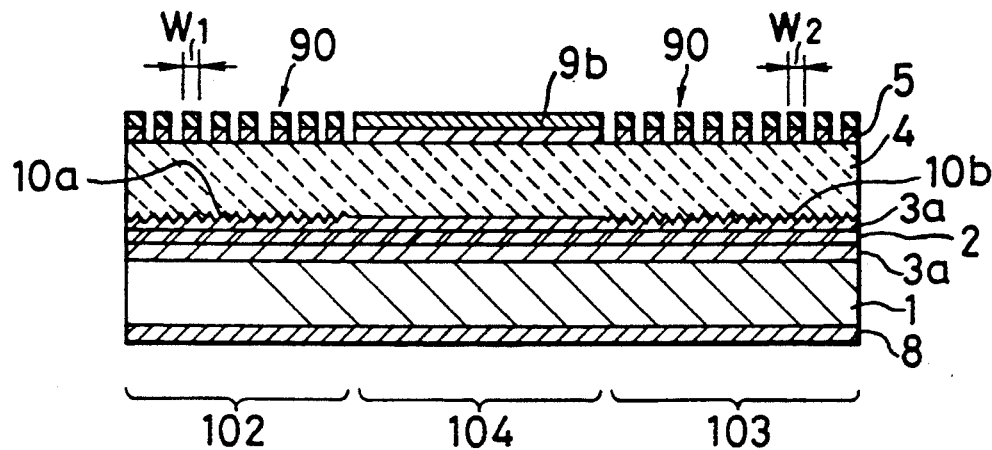
FIG. 15B is a schematic cross-sectional view taken along the line 15B—15B in FIG. 15A, showing a distributed feed back type semiconductor laser according to a fifth example of the present invention.
Figure 15C:
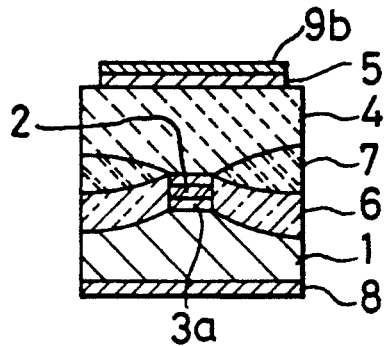
FIG. 15C is a schematic cross-sectional view taken along the line 15C—15C in FIG. 15A, showing a distributed feed back type semiconductor laser according to a fifth example of the present invention.

FIGS. 15A to 15C are schematic views showing a wavelength-tunable distributed feed back type semiconductor laser according to a fifth example of the present invention. FIG. 15A is a schematic plan view showing the distributed feed back type semiconductor laser of the instant example. FIG. 15B is a schematic cross-sectional view taken along the line 15B—15B, showing the distributed feed back type semiconductor laser shown in FIG. 15A, and FIG. 15C is a schematic cross-sectional view taken along the line 15C—15C, showing the distributed reflector type semiconductor laser shown in FIG. 15A. In FIGS. 15A to 15C, reference numerals 1 to 8, 10a, 10b, 11, 30, and 101 to 104 are the same as in FIG. 14, and 9b denotes a p-type electrode provided in the phase adjustment region 104, 9c and 9d a set of comb-shaped p-type electrodes provided in the front distributed reflector region 102, 9e and 9f a set of comb-shaped p-type electrodes provided in the rear distributed reflector region 103, and 90 tooth of comb-shaped electrode. Here, the diffractive grating 10 is one according to the first embodiment described above. However, diffractive gratings according to the second to fourth embodiments may also be used with similar effects.

The distributed reflector type semiconductor laser of the instant example can be fabricated in a manner similar to Example 1 except that instead of the electrodes 9, the comb-shaped electrodes 9c and 9d, and 9e and 9f are formed in the front and rear distributed reflector regions 102 and 103, respectively.

In the diffractive grating used in the wavelength-tunable distributed reflector type semiconductor laser according to the instant example, the repeating unit region of which the pitch of the diffractive grating 10a intermittently varies from 2459 Å to 2389 Å is repeated at a period of 75 μm while the repeating unit region of which the pitch of the diffractive grating 10b intermittently varies from 2454 Å to 2385 Å is repeated at a period 67.5 μm. Each comb-shaped electrode has a plurality of teeth 90 arranged at the same period as the pitch modulation period. That is, the individual electrodes (teeth) 90 of the comb-shaped electrodes 9c and 9d for the front distributed reflector region 102 are arranged at a period of 75 μm and the width $w_1$ of a single tooth 90 is about half this period (about 37.5 μm). The individual electrodes (teeth) 90 of the comb-shaped electrodes 9e and 9f are arranged at a period of 67.5 μm and the width $w_2$ of a single tooth 90 is about half this period (about 33.75 μm).

The distributed reflector type semiconductor laser having the above-described construction lases upon application of current to the active region 101 thereof, and the lasing wavelength varies upon application of current or voltage separately and independently to the distributed reflector regions 102 and 103, and the phase adjustment region 104.

FIG. 11 illustrates the variation of lasing wavelength when current applied to the comb-shaped electrode 9e in the distributed reflector region 103 varies under in a state where a constant current is applied to the comb-shaped electrodes 9c and 9d in the front distributed reflector region 102 and the comb-shaped electrode 9f in the rear distributed reflector region 103, and the p-type electrode 9b in the phase adjustment region 104 to lase. As illustrated in FIG. 11, in the distributed feed back type semiconductor laser of the instant example, application of current to the distributed reflector region 103 results in intermittent change of lasing wavelength from 1.575 μm to 1.530 μm at an interval of about 50 μm.

Further, it is possible to conduct fine control of the lasing wavelength by independently applying a current of a fixed intensity to the comb-shaped electrode 9e, selecting one of different lasing wavelengths differing one from another at an interval of about 50 Å, electrically short-circuiting the comb-shaped electrodes 9d and 9f, and applying current to the short-circuited electrodes and varying the intensity of the current simultaneously. FIG. 12 illustrates relationship between variation of lasing wavelength and current. Solid lines in FIG. 12 represent behavior of wavelength when the current applied to the aforementioned short-circuited comb-shaped electrodes 9d and 9f varies. As illustrated in FIG. 12, with the distributed feed back type semiconductor laser, simultaneous application of current to the short-circuited comb-shaped electrodes 9d and 9f results in variation in lasing wavelength by about 50 Å with a leap in wavelength.

Further, broken lines in FIG. 12 represent behavior of wavelength when current is applied to the p-type electrode 9b provided in the phase adjustment region 104, and the current applied to the short-circuited comb-shaped electrodes 9d and 9f varies by varying the intensity of the current applied to the electrode 9b. Thus, it is possible to conduct further fine control of the lasing wavelength by controlling the current to the p-type electrode 9b in the phase adjustment region.

Adjustment of the currents applied to the p-type electrodes 9b to 9f, respectively, by the aforementioned procedure, enables coarse adjustment and fine adjustment of the lasing wavelength and selection of any desired lasing wavelength from over entire bandwidth of 450 Å.

EXAMPLE 6

A wavelength-tunable distributed reflector type semiconductor laser according to a sixth example of the present invention will be described below.

In the distributed reflector type semiconductor lasers according to Examples 4 and 5, respectively, of the present invention, the pitch modulation period of the diffractive grating is the same as that at which the individual electrodes or teeth of the comb-shaped electrodes are arranged. When the period of repetition of the individual electrodes of the comb-shaped electrodes is smaller than the pitch modulation period of the diffractive grating, similar effects can be obtained as Examples 4 and 5 above. On the other hand, when the former is larger than the latter, different effects can be obtained. As an example of this, explanation will be made hereinbelow as to how to control the lasing wavelength of a semiconductor laser which is of the same structure as the wavelength-tunable semiconductor laser described in Example 5 as shown in FIGS. 15A to 15C except that the widths of the individual electrodes of the comb-shaped electrodes 9c to 9f are twice as large as those in the case of Example 5.

FIGS. 13A to 13C each illustrate reflectivity characteristics of the distributed reflector region of the semiconductor laser according to the instant example. When no current is applied to the comb-shaped electrodes, the reflectivity characteristics of the distributed reflector region are as illustrated in FIG. 13A. That is, reflectivity peaks appear periodically at a wavelength spacing $\Delta\lambda_f$ approximately defined by the pitch modulation period $M_f$ of the diffractive grating. Here, application of current to one of a set of the comb-shaped electrodes whose individual electrodes or teeth formed above the diffractive grating at a period of $2M_f$ results in variation of the refractive index at a period of $2M_f$, so that the distributed reflector can have reflectivity characteristics such that reflectivity peaks appear periodically at a wavelength spacing of $\Delta\lambda_f/2$ as illustrated in FIG. 13B. Further, when the amount of current to be applied to the electrode increases, reflectivity characteristics varies as if the reflectivity peaks when no current is applied are shifted by an amount of $\Delta\lambda_f/2$. Coarse adjustment of lasing wavelength can be realized at a wavelength spacing of $\Delta\lambda_f/2$ based on this principle. In other words, the semiconductor lasers of Examples 4 and 5 enable coarse adjustment of a lasing wavelength at an interval of 50 Å while the semiconductor laser of the instant examples allows coarse adjustment of a lasing wavelength at an interval of 25 Å.

EXAMPLE 7

Figure 16:
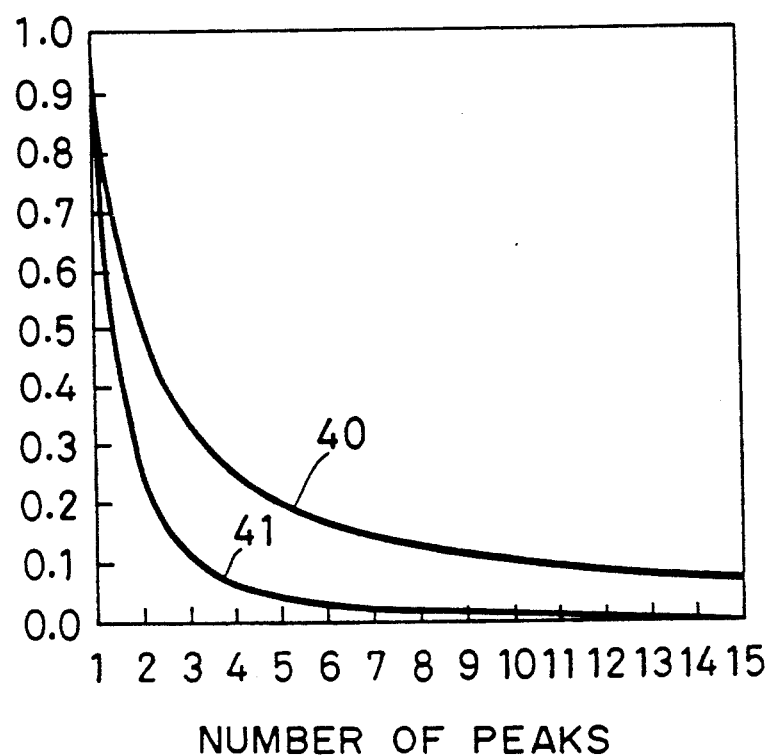
FIG. 16 is a graph illustrating reflectivity characteristics of distributed reflectors of the present invention and a second conventional example for comparison.

FIG. 16 is a graph illustrating relationship between number of peaks and reflection factor of a distributed reflector of a distributed reflector, comparing the present invention with a second conventional example. Horizontal axis indicates number of reflectivity peaks and vertical axis reflectivity of a central peak. Curve 40 represents reflectivity characteristics of the distributed reflector of the present invention while Curve 41 relates to the reflectivity characteristics of the second conventional example. In the both cases, depth of diffractive grating is constant. No remarkable decrease in reflectivity despite increase in the number of peaks along the horizontal axis indicates that lasing is possible within a wavelength range wide enough to cover the number of reflectivity peaks. In the present invention, reflection factor is large enough when the number of reflectivity peaks is 10 or more. On the contrary, in the second conventional example, reflection factor decreases to a considerably low level when the number of reflectivity peaks approaches 10, thus making it impossible to realize lasing at low threshold, and at worst lasing stops. Therefore, such a distributed reflector as that of the second conventional example, laser emission in a broader wavelength band was difficult.

The present invention has been described in detail with respect to preferred embodiments, and it will now be apparent from the foregoing to those skilled in the art that changes and modifications may be made without departing from the present invention in its broader aspects, and it is the intention, therefore, in the appended claims to cover all such changes and modifications as fall within the true spirit of the invention.

What is claimed is:

1. A distributed reflector comprising:
   a substrate;
   at least one optical waveguide layer provided on said substrate and having an optical refractive index greater than the substrate;
   at least one optical confinement layer provided on said substrate and having an optical refractive index smaller than the optical waveguide layer; and
   a diffractive grating provided in at least one of layers constituting said optical waveguide and having a period,
   said distributed reflector reflecting light having a wavelength approximately defined by Bragg diffraction conditions,
   wherein said diffractive grating has a plurality of repeating unit regions each having a constant length, thus forming a modulation period, and at least one parameter that determines an optical reflectivity of said diffractive grating varies depending on its position in each of said repeating unit regions along a direction of optical transmission in said distributed reflector; and
   wherein said diffractive grating extends by at least two modulation periods.

2. The distributed reflector as claimed in claim 1, wherein said parameter is a length of a single period.

3. The distributed reflector as claimed in claim 1, wherein said parameter is a coupling coefficient.

4. The distributed reflector as claimed in claim 1, wherein said parameter is a bandgap composition of at least one of said optical waveguide layer in said direction of optical transmission.

5. The distributed reflector as claimed in claim 1, wherein said parameter is at least one phase shift in which a length of a single period of said diffractive grating differs.

6. The distributed reflector as claimed in claim 1, wherein said substrate is a semiconductor substrate.

7. A distributed reflector semiconductor laser having an optical waveguide comprising:
   an active waveguide layer defining an active waveguide region,
   at least one inactive waveguide layer optically connected to said active waveguide layer, defining an inactive region having a refractive index,
   a diffractive grating provided in at least a portion of said inactive region;
   a distributed reflector constituted by said diffractive grating, said active region and said inactive region;
   said active region having an optical gain to light having a wavelength which said distributed reflector reflects;
   said active region having an optical amplification action and said distributed reflector having a reflection action, and together causing lasing at at least one of reflection wavelengths in said distributed reflector;
   said diffractive grating in said at least one distributed reflector having a plurality of repeating unit regions each having a constant length, thus forming a modulation period, and at least one parameter that determines an optical reflectivity of said diffractive grating varying depending on its position in each of said repeating unit regions along a direction of optical transmission in said distributed reflector;
   said diffractive grating extending by at least two modulation periods; and
   means for electrically controlling said refractive index of said inactive region.

8. The distributed reflector semiconductor laser as claimed in claim 7, wherein said parameter is a length of a single period.

9. The distributed reflector semiconductor laser as claimed in claim 7, wherein said parameter is a coupling coefficient.

10. The distributed reflector semiconductor laser as claimed in claim 7, wherein said parameter is a bandgap composition of at least one of said optical waveguide layer in said direction of optical transmission.

11. The distributed reflector semiconductor laser as claimed in claim 7, wherein said parameter is at least one phase shift in which a length of a single period of said diffractive grating differs.

12. The distributed reflector semiconductor laser as claimed in claim 7, wherein said means for controlling said refractive index is means for injecting current in said inactive region in which said diffractive grating is present.

13. The distributed reflector semiconductor laser as claimed in claim 7, wherein said means for controlling said refractive index is means for injecting current in said inactive region in which said diffractive grating is absent.

14. The distributed reflector semiconductor laser as claimed in claim 12, further comprising two sets of independently arranged comb-shaped electrodes in said inactive region in which said diffractive grating is present.

15. A distributed feed back semiconductor laser having an optical waveguide comprising:
   an active waveguide layer defining an active region having a refractive index,
   an inactive waveguide layer optically connected to said active waveguide layer, defining an inactive region,
   a diffractive grating provided in at least a portion of said active region;
   a distributed reflector constituted by said diffractive grating, said active region and said inactive region;
   said active region having an optical gain to light having a wavelength which said distributed reflector reflects;
   said active region having an optical amplification action and said distributed reflector having a reflection action, and together causing lasing at least one of reflection wavelengths in said distributed reflector;
   said diffractive grating in said at least one distributed reflector having a plurality of repeating unit regions each having a constant length, thus forming a modulation period, and at least one parameter that determines an optical reflectivity of the diffractive grating varying depending on its position in each of said repeating unit regions along a direction of optical transmission in the distributed reflector;

said diffractive grating extending by at least two modulation periods; and means for electrically controlling said refractive index of said inactive region.

16. The distributed feed back semiconductor laser as claimed in claim 15, wherein said parameter is a length of a single period.

17. The distributed feed back semiconductor laser as claimed in claim 15, wherein said parameter is a coupling coefficient.

18. The distributed feed back semiconductor laser as claimed in claim 15, wherein said parameter is a bandgap composition of at least one of said optical waveguide layer in said direction of optical transmission.

19. The distributed feed back semiconductor laser as claimed in claim 15, wherein said parameter is at least one phase shift in which a length of a single period of said diffractive grating differs.

20. The distributed feed back semiconductor laser as claimed in claim 15, wherein said means for controlling said refractive index is means for injecting current in said active region in which said diffractive grating is present.

21. The distributed feed back semiconductor laser as claimed in claim 15, wherein said means for controlling said refractive index is means for injecting current in said active region in which said diffractive grating is absent.

22. The distributed feed back semiconductor laser as claimed in claim 20, further comprising two sets of independently arranged comb-shaped electrodes in said active region in which said diffractive grating is present.

23. The distributed feed back semiconductor laser as claimed in claim 15, further comprising:

a wavelength control layer which is transparent to emitted light and controls said refractive index of said active region by variation in density of a carrier; and means for independently controlling currents injected in said active waveguide layer and said wavelength control layer;

whereby enabling tuning a lasing wavelength by said current injected to said wavelength control layer.

* * * * *

UNITED STATES PATENT AND TRADEMARK OFFICE
CERTIFICATE OF CORRECTION

PATENT NO. : 5,325,392
DATED : June 28, 1994
INVENTOR(S) : Tohmori et al.

It is certified that error appears in the above-indentified patent and that said Letters Patent is hereby corrected as shown below:

Title Page:
Section 75: Inventors: The first name of the 2nd inventor has been omitted. Please change "Yoshikuni" to --Yuzo Yoshikuni--.

Signed and Sealed this

Thirtieth Day of August, 1994

Attest:

BRUCE LEHMAN

Attesting Officer

*Commissioner of Patents and Trademarks*